(12) United States Patent
Ohsawa

(10) Patent No.: US 7,719,271 B2
(45) Date of Patent: May 18, 2010

(54) RF COIL AND TRANSMISSION LINE HANDLING SYSTEM FOR MAGNETIC RESONANCE IMAGING APPARATUS

(75) Inventor: Takuhiro Ohsawa, Yaita (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 0 days.

(21) Appl. No.: 11/806,737

(22) Filed: Jun. 4, 2007

(65) Prior Publication Data

US 2008/0106262 A1 May 8, 2008

(30) Foreign Application Priority Data

Jun. 8, 2006 (JP) .............................. 2006-159599
May 24, 2007 (JP) .............................. 2007-138036

(51) Int. Cl.
*G01V 3/00* (2006.01)
(52) U.S. Cl. ..................... 324/307; 324/309; 324/318
(58) Field of Classification Search ......... 324/300–322; 600/410–435
See application file for complete search history.

(56) References Cited

U.S. PATENT DOCUMENTS

| | | | | |
|---|---|---|---|---|
| 5,027,818 A * | 7/1991 | Bova et al. | ................... | 600/427 |
| 5,144,243 A * | 9/1992 | Nakabayashi et al. | ....... | 324/318 |
| 5,197,474 A * | 3/1993 | Englund et al. | ............. | 600/415 |
| 5,363,845 A * | 11/1994 | Chowdhury et al. | ........ | 600/422 |
| 5,430,378 A * | 7/1995 | Jones | ........................ | 324/318 |
| 5,623,927 A * | 4/1997 | Damadian et al. | ........... | 600/415 |
| 5,666,055 A * | 9/1997 | Jones et al. | ................. | 324/318 |
| 6,326,789 B1 * | 12/2001 | Yoshida et al. | .............. | 324/318 |
| 6,438,402 B1 * | 8/2002 | Hashoian et al. | ............ | 600/410 |
| 6,831,461 B2 * | 12/2004 | Arz et al. | ..................... | 324/318 |
| 6,867,593 B2 * | 3/2005 | Menon et al. | ............... | 324/318 |
| 6,934,574 B1 * | 8/2005 | Damadian et al. | ........... | 600/415 |
| 7,141,976 B2 * | 11/2006 | Campagna | .................. | 324/318 |
| 7,171,254 B2 * | 1/2007 | Vavrek et al. | ............... | 600/422 |
| 7,218,106 B2 * | 5/2007 | Yasuhara et al. | ............ | 324/307 |
| 7,386,338 B2 * | 6/2008 | Hoppel et al. | ............... | 600/422 |
| 7,391,214 B2 * | 6/2008 | Adachi | ........................ | 324/318 |
| 7,394,253 B2 * | 7/2008 | Okamoto et al. | ............ | 324/318 |
| 2007/0035301 A1 * | 2/2007 | Nakabayashi et al. | ....... | 324/318 |
| 2007/0191706 A1 * | 8/2007 | Calderon et al. | ............ | 600/415 |

FOREIGN PATENT DOCUMENTS

| | | |
|---|---|---|
| JP | 05-317290 | 12/1993 |
| JP | 06-315473 | 11/1994 |
| JP | 2006-087766 | 4/2006 |

* cited by examiner

*Primary Examiner*—Brij B Shrivastav
*Assistant Examiner*—Dixomara Vargas
(74) *Attorney, Agent, or Firm*—Nixon & Vanderhye PC

(57) ABSTRACT

A magnetic resonance imaging apparatus includes a gantry having an imaging space therein, a receiving circuit that receives a magnetic resonance signal emitted from a subject arranged in the imaging space, and a bed device on which the subjected is mounted, wherein the bed device includes a top panel on which the subject is mounted, a bed support section which supports the top panel to enable moving the top panel in such a manner that the subject mounted on the top panel is positioned in the imaging space, connection ports provided on the top panel to connect signal transmission cables of RF coils which convert the magnetic resonance signal into an electric signal, and connecting unit which electrically connects the signal transmission cables with the receiving circuit through the inside of the bed support section.

14 Claims, 20 Drawing Sheets

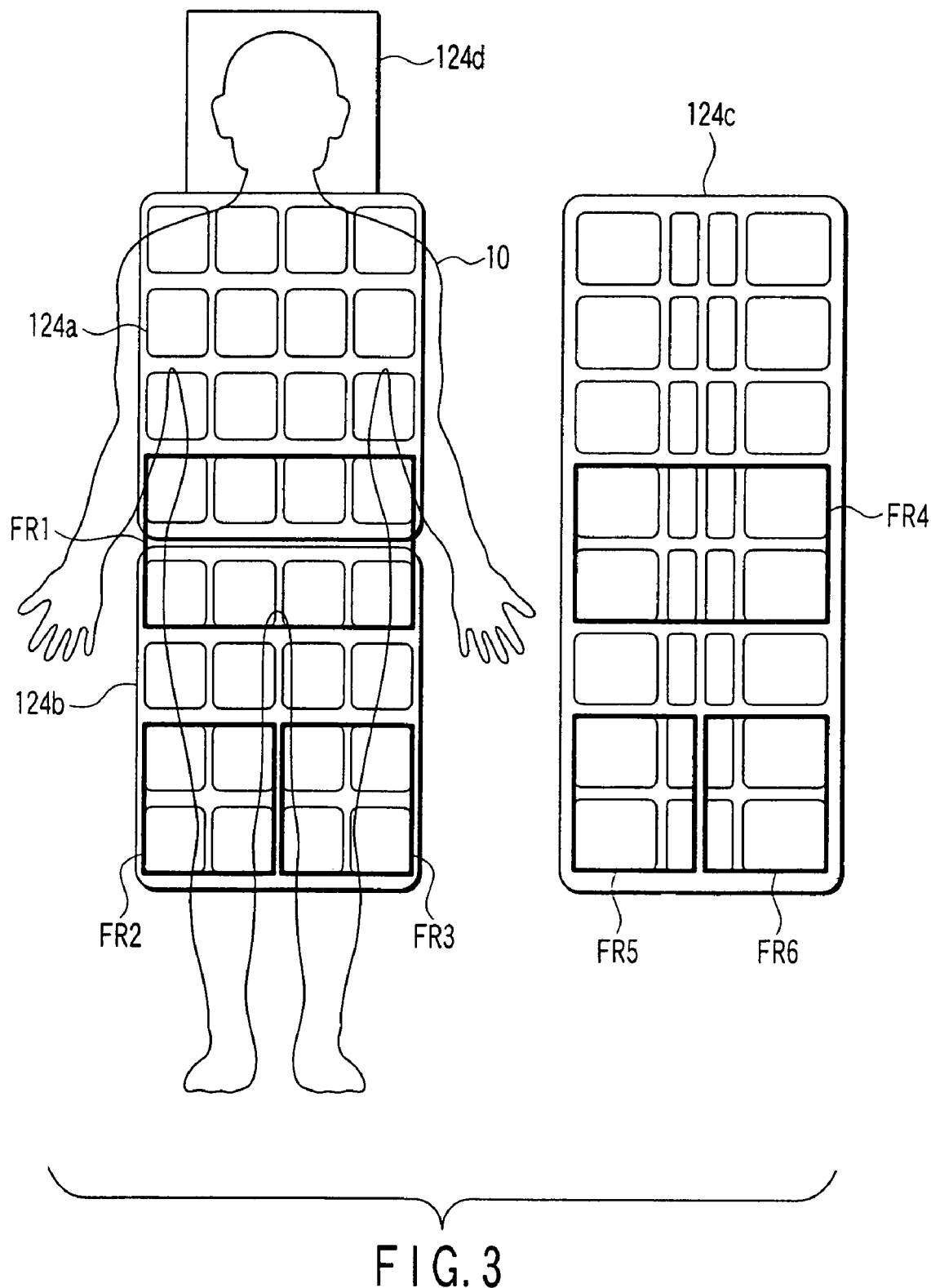
F I G. 3

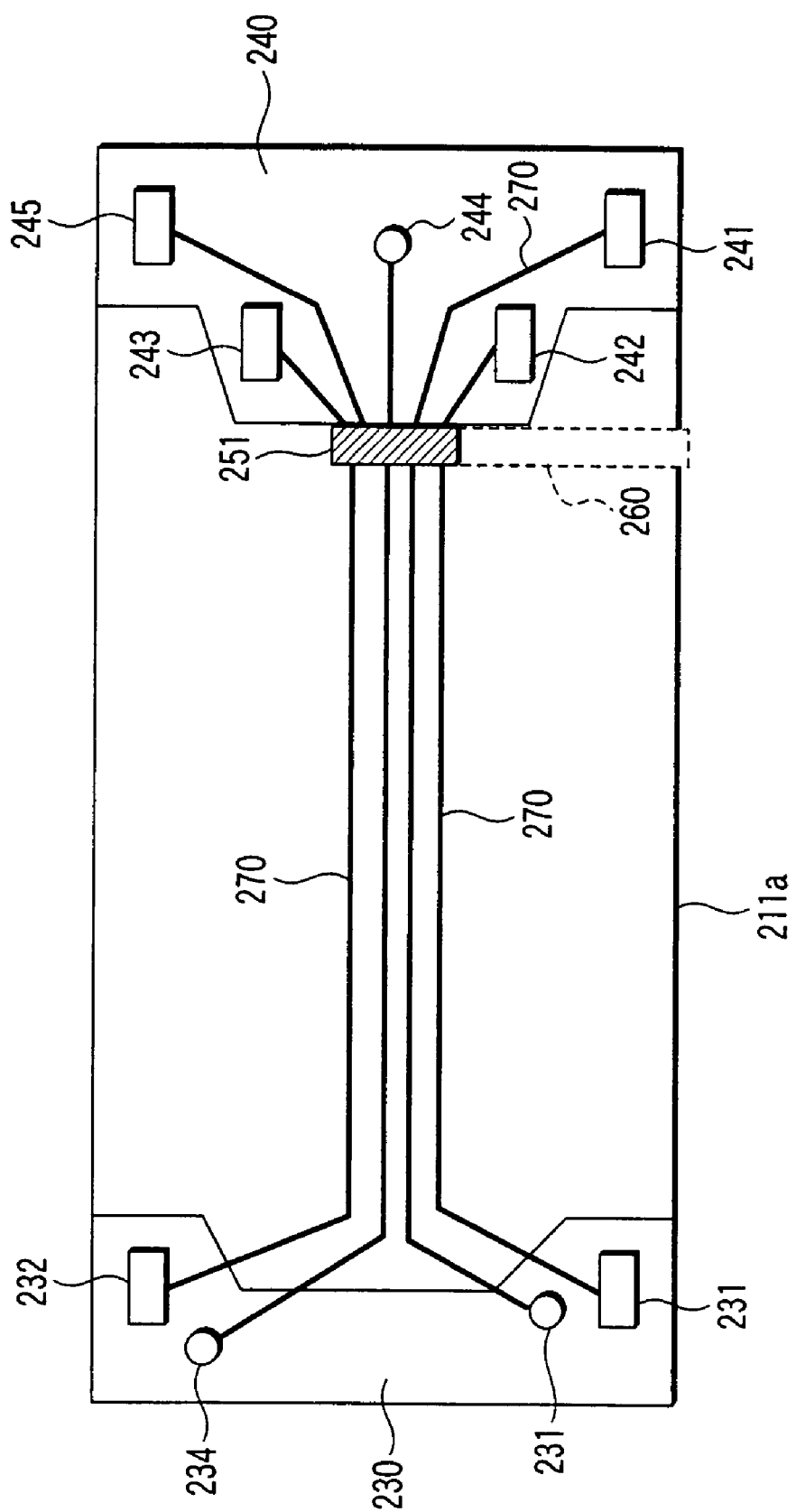
F I G. 5

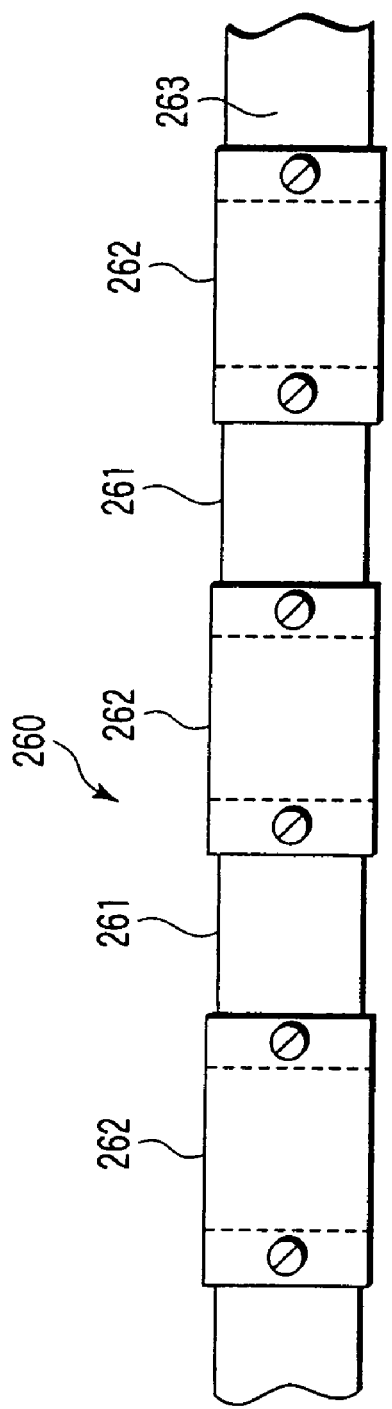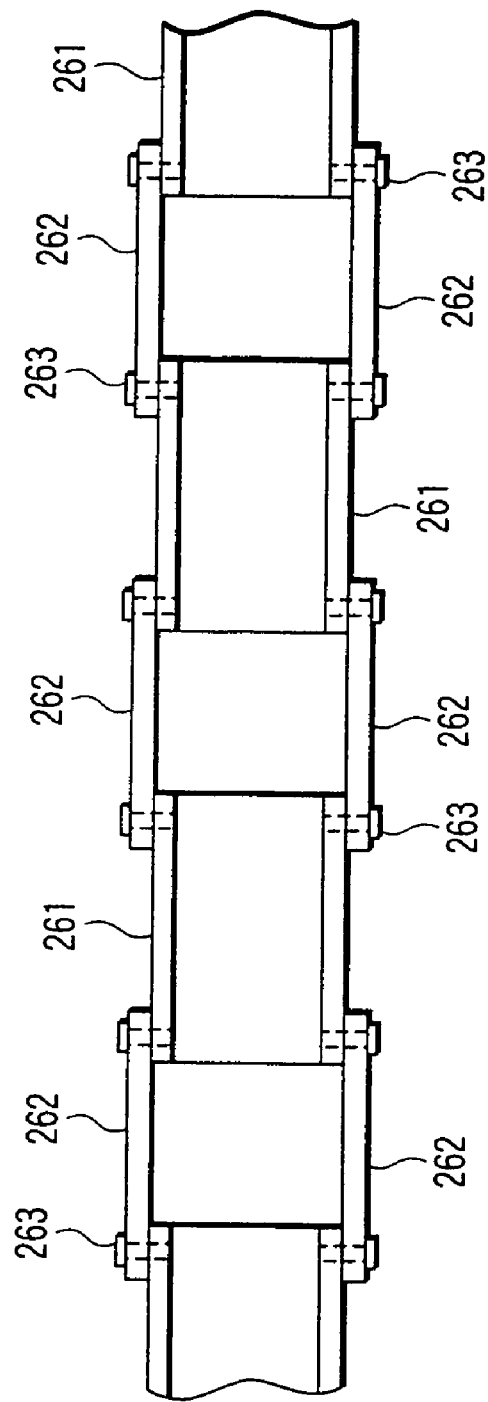
F I G. 6A
F I G. 6B

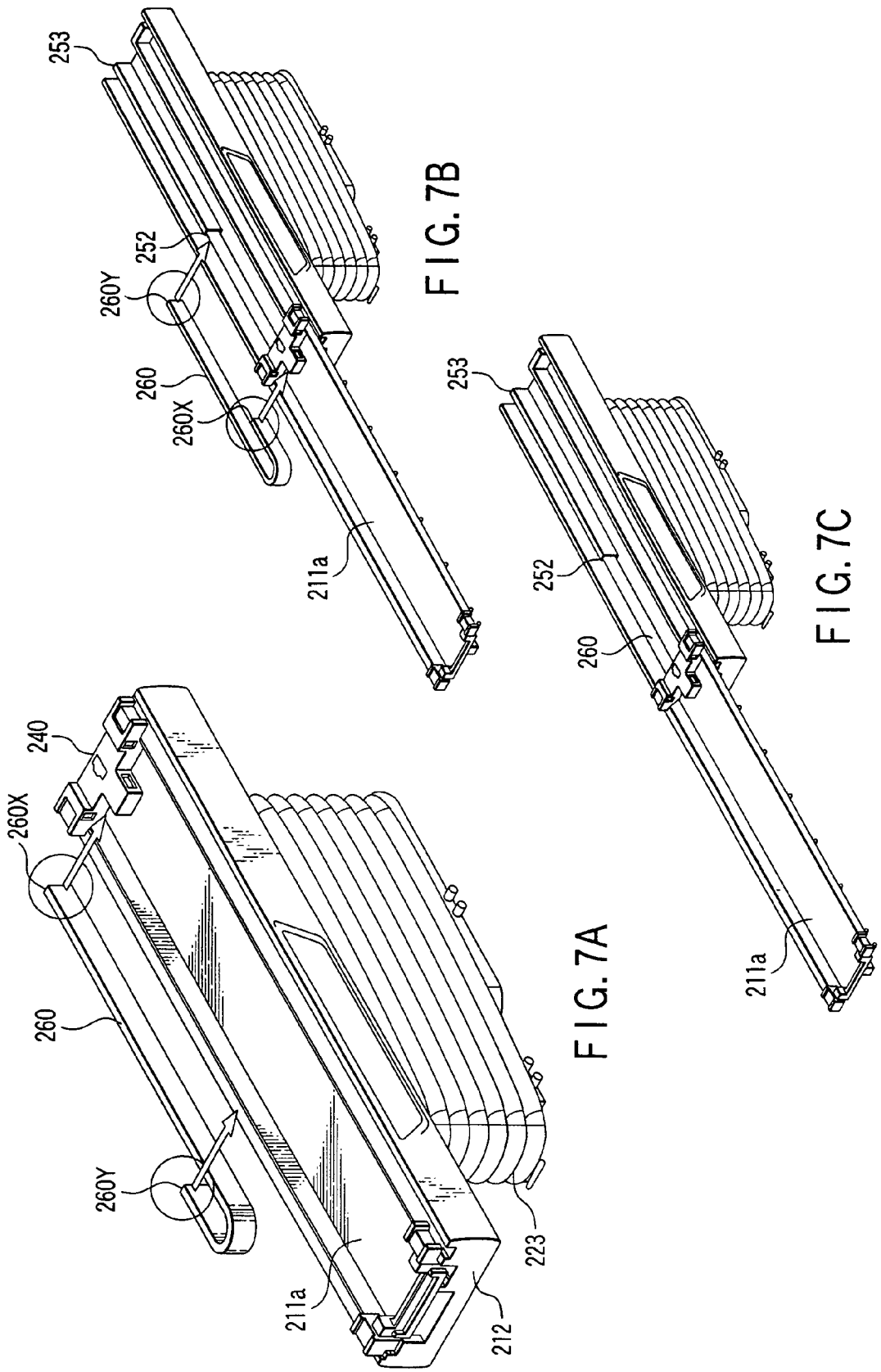

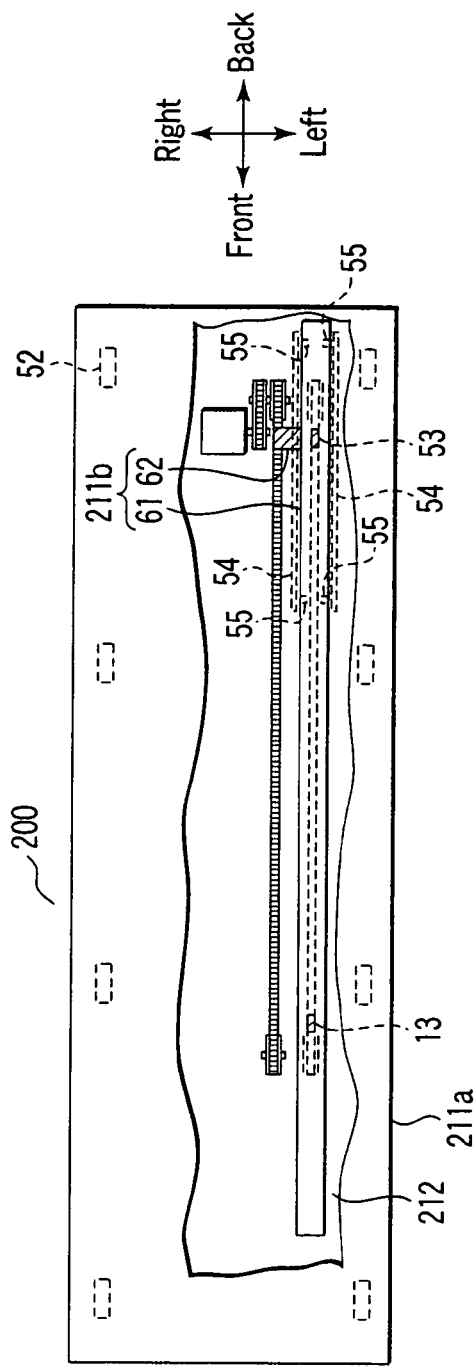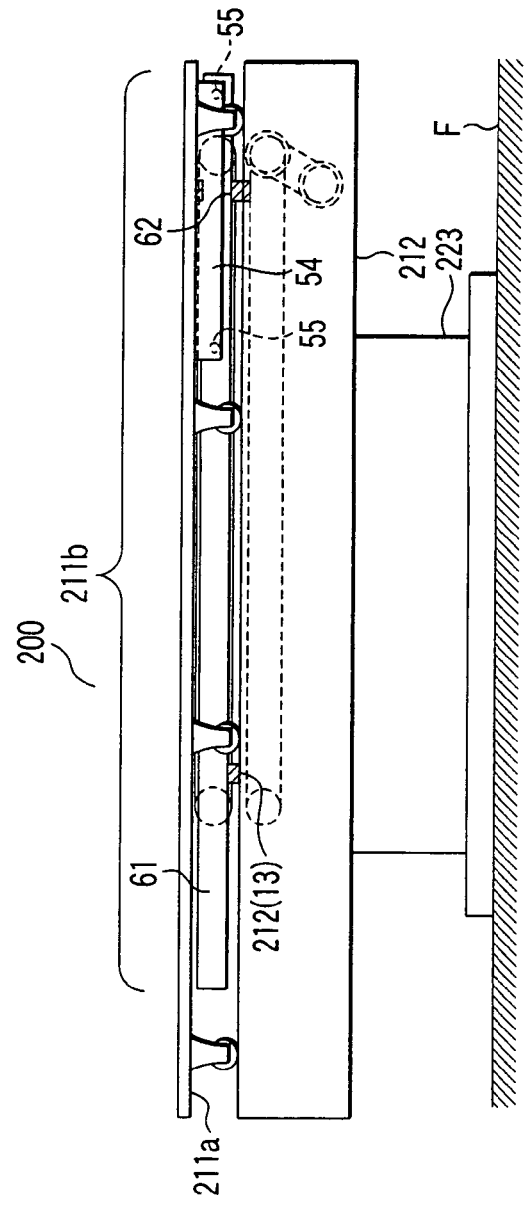
FIG. 9A
FIG. 9B

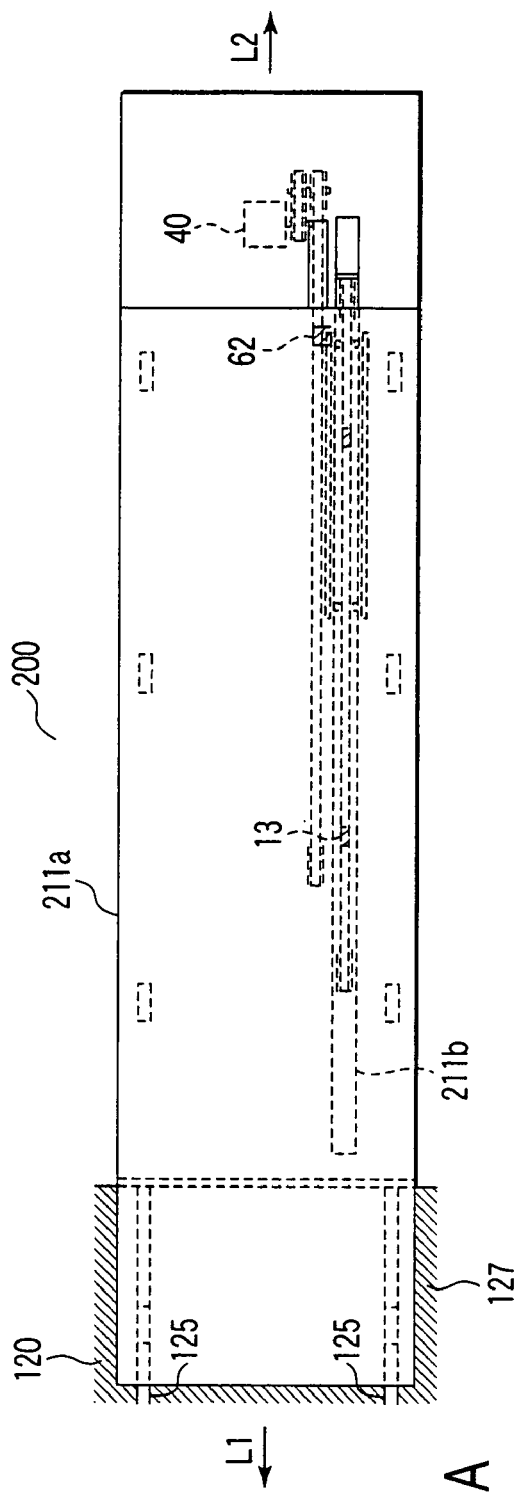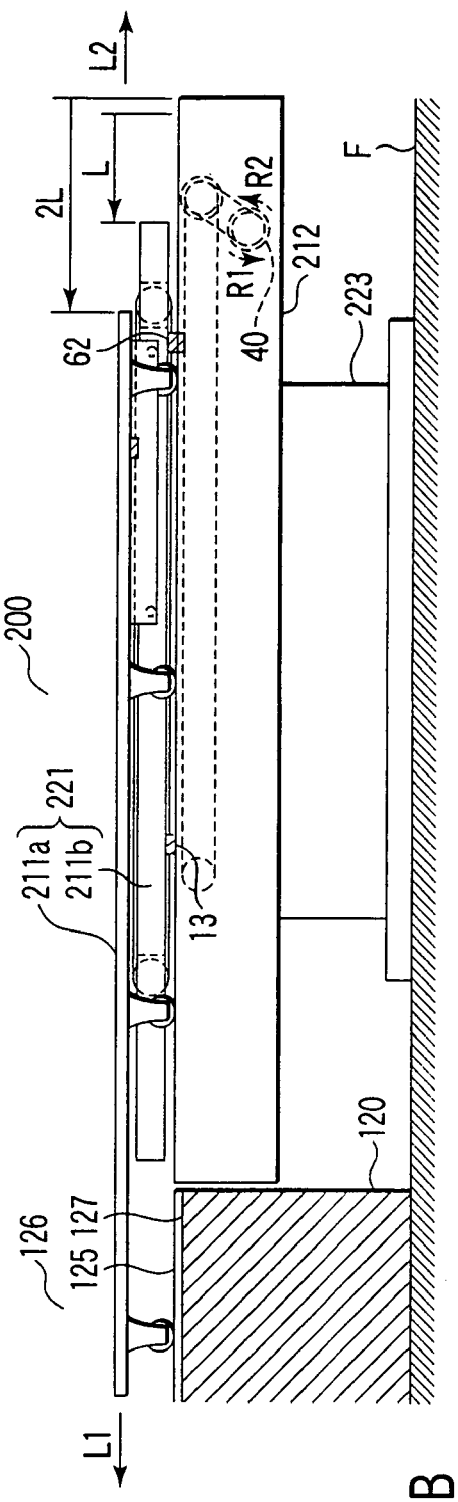
FIG. 13A
FIG. 13B

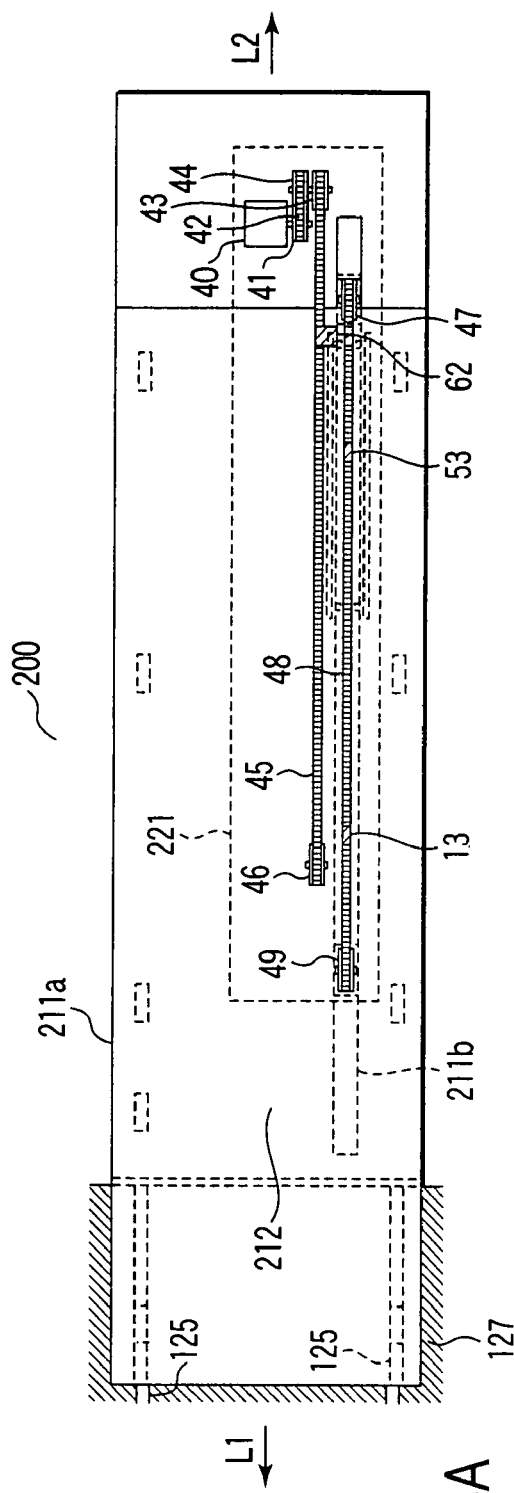
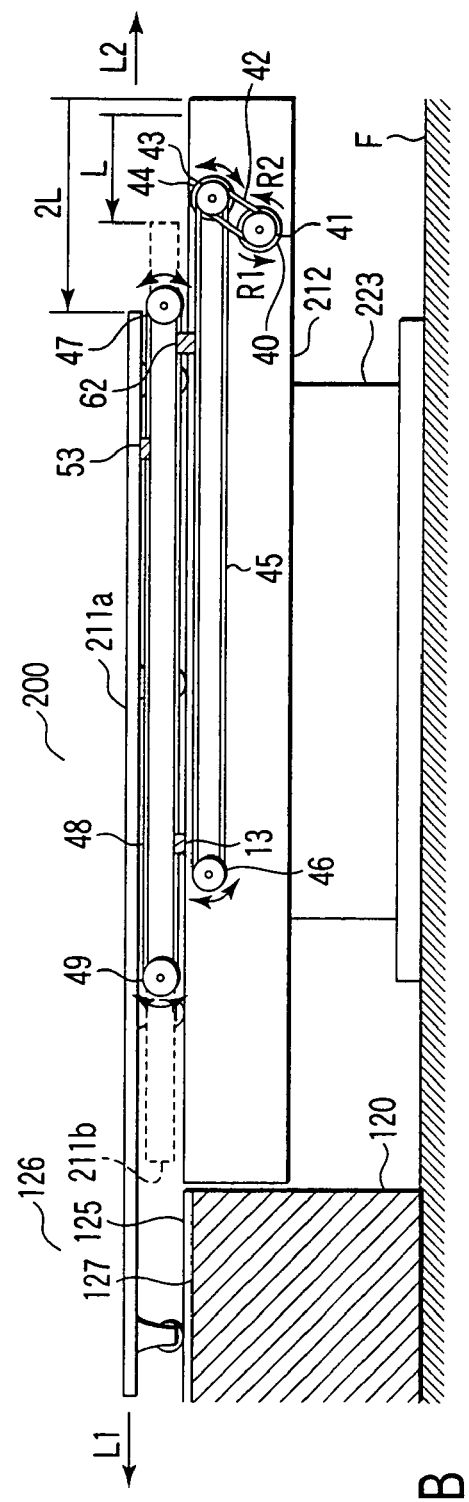
FIG. 14A
FIG. 14B

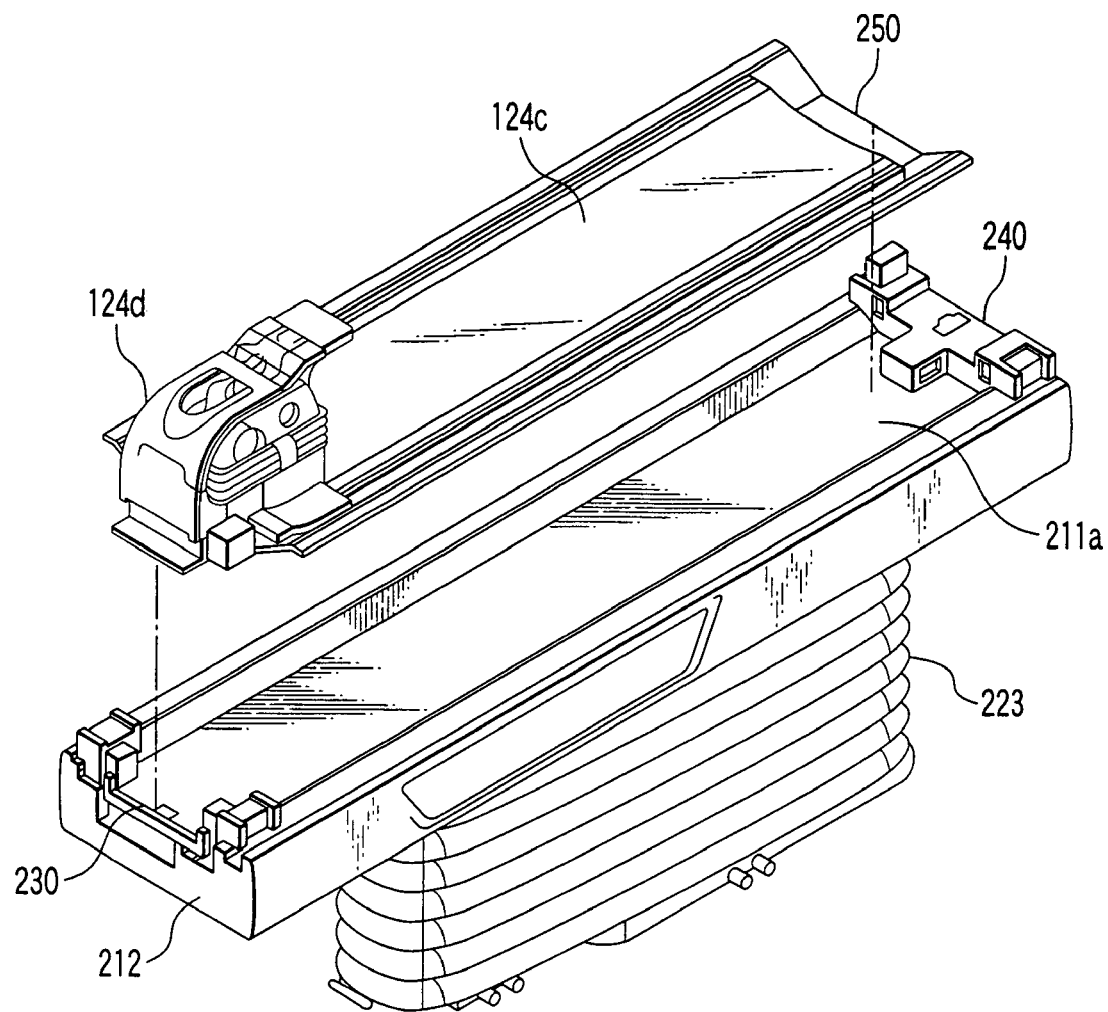
F I G. 16

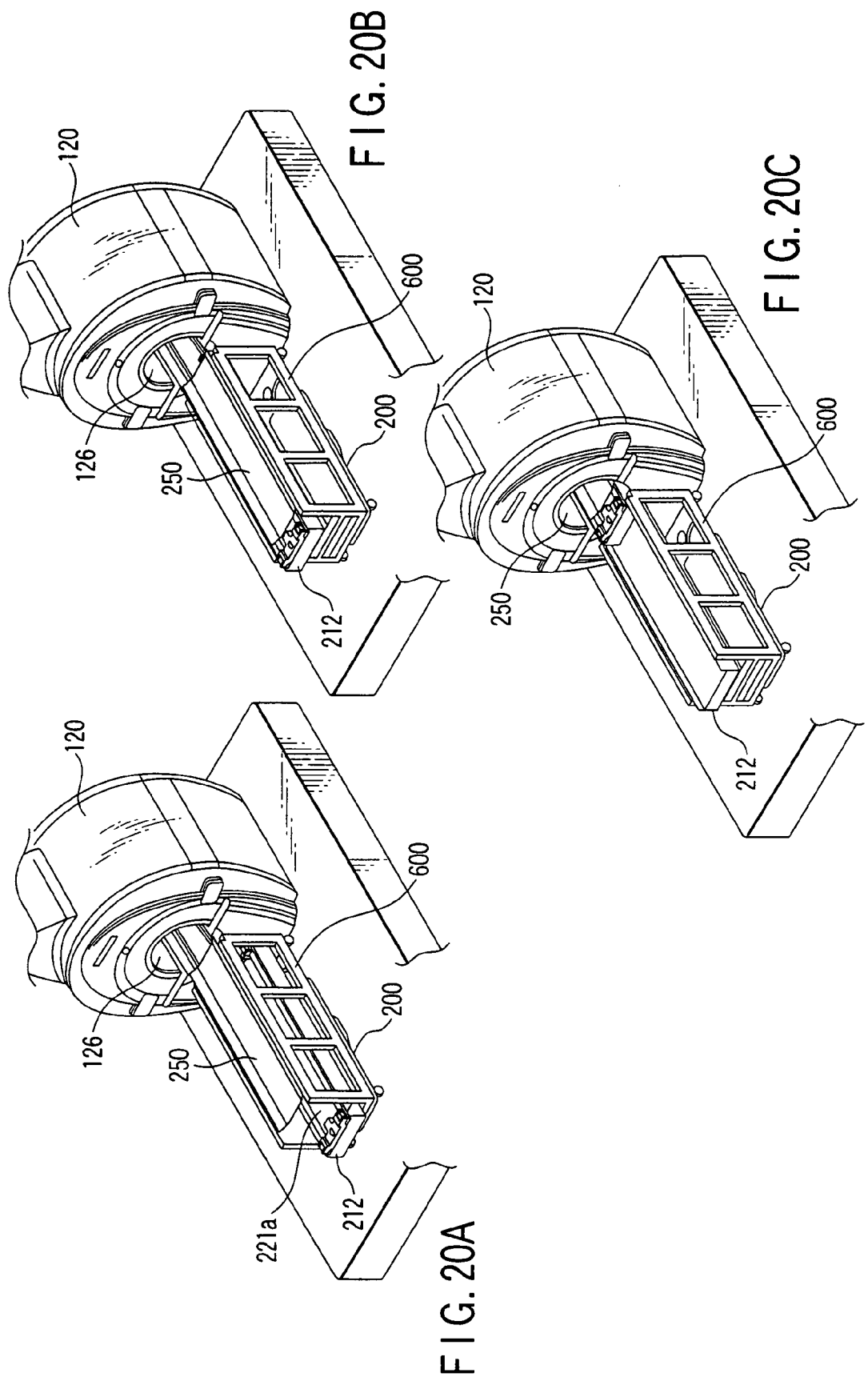

RF COIL AND TRANSMISSION LINE HANDLING SYSTEM FOR MAGNETIC RESONANCE IMAGING APPARATUS

CROSS-REFERENCE TO RELATED APPLICATIONS

This application is based upon and claims the benefit of priority from prior Japanese Patent Applications No. 2006-159599, filed Jun. 8, 2006; and No. 2007-138036, filed May 24, 2007, the entire contents of both of which are incorporated herein by reference.

BACKGROUND OF THE INVENTION

1. Field of the Invention

The present invention relates to a magnetic resonance imaging apparatus that receives a magnetic resonance signal emitted from a subject by a receiving coil arranged on a top panel side on which the subjected is mounted.

2. Description of the Related Art

A magnetic resonance imaging apparatus generates image data about a subject based on a magnetic resonance signal (an MR signal) detected from the inside of the subject. More specifically, the magnetic resonance imaging apparatus reconstructs a magnetic resonance image (an MR image) concerning a subject arranged in a static magnetic field space based on an MR signal that is acquired by applying to the subject a gradient magnetic field that adds positional information to an excitation magnetic field (an RF magnetic field) and a static magnetic field. The magnetic resonance imaging apparatus can obtain not only anatomical diagnostic information but also many kinds of diagnostic information, e.g., biochemical information or functional diagnostic information, and hence it is important in the field of diagnostic imaging today.

The magnetic resonance imaging apparatus has a gantry forming a substantially cylindrical imaging space at the center thereof. A static magnetic field coil, a gradient coil, and an excitation coil are provided on the gantry to generate a static magnetic field, a gradient magnetic field, and an excitation magnetic field in the imaging space.

The MR signal is a weak signal emitted from the subject, and receiving this signal at a position as close to the subject as possible is preferable. Therefore, when obtaining, e.g., an MR image of a head region, a cylindrical receiving coil is disposed to a top panel of a bed and the head region of the subject mounted on the top panel is inserted into the receiving coil.

Meanwhile, reconstruction of an image based on the MR signal is carried out in a signal processing section. Thus, the MR signal received by the receiving coil is supplied to the signal processing section through a cable that connects the receiving coil with the signal processing section. The cable is conventionally arranged in the imaging space of the gantry with slack to adapt to a movement of the top panel. That is, in a state where the top panel is placed outside the gantry imaging space, the cable is substantially drawn out of an opening potion of the imaging space. When the top panel is fed into the gantry imaging space, the cable is pulled into the imaging space while increasing an amount of slack in accordance with a feeding distance. Further, a side of this cable that is connected with the signal processing section is pulled toward the outside of the gantry from a substantially central part of the imaging space through the inside of the gantry, and connected with the signal processing section disposed apart from the gantry. Such a structure is known from, e.g., Jpn. Pat. Appln. KOKAI Publication No. 8-593.

According to such a conventional structure, in a state where the top panel is placed outside the imaging space, the cable is pulled to a position above the top panel outside the imaging space from the inside of the imaging space. The cable in such a state obstructs, e.g., an operation of mounting the subject on the top panel, thereby becoming a factor of a reduction in an operation efficiency or safety.

In recent years in particular, simultaneous use of a plurality of receiving coils has been demanded to collect image data in a wide range or collect image data of a plurality of regions. When using the plurality of receiving coils on the gantry in this manner, a plurality of cables connected with these receiving coils on the gantry are pulled to the outside of an image space from the inside of the imaging space, thereby further reducing the operation efficiency or safety.

BRIEF SUMMARY OF THE INVENTION

In view of such circumstances, preventing the cable from obstructing an operation in a state where the top panel is placed outside the imaging space has been demanded.

According to an aspect of the present invention, there is provided a magnetic resonance imaging apparatus comprising: a gantry having an imaging space therein; a receiving circuit that receives a magnetic resonance signal emitted from a subject arranged in the imaging space; and a bed device on which the subjected is mounted, wherein the bed device comprises: a top panel on which the subject is mounted; a bed support section which supports the top panel to enable moving the top panel in such a manner that the subject mounted on the top panel is positioned in the imaging space; connection ports provided on the top panel to connect signal transmission cables of RF coils which convert the magnetic resonance signal into an electric signal; and connecting unit which electrically connects the signal transmission cables with the receiving circuit through the inside of the bed support section.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 3 is a view showing an example of a use state of receiving coils;

FIG. 5 is a plan view schematically showing a rear surface of the top panel;

FIGS. 6A and 6B are views schematically showing a structure of a cable guide;

FIGS. 7A, 7B, and 7C are perspective views showing an attachment state of the cable guide with respect to the bed device and changes in a state of the cable guide with a movement of the top panel;

FIGS. 9A and 9B are views showing a detail of a structure of a middle frame;

FIGS. 13A and 13B are views showing a state where the top panel is moving to an imaging position of an imaging space;

FIGS. 14A and 14B are views for explaining an operation of the horizontal movement mechanism section;

FIG. 16 is a view showing an appearance of a stretcher top panel and an attachment state of the same with respect to the bed device;

FIGS. 20A, 20B, and 20C are schematic views showing transition when the stretcher top panel mounted on the stretcher coupled with the bed device is fed into the imaging space.

DETAILED DESCRIPTION OF THE INVENTION

Figure 1:
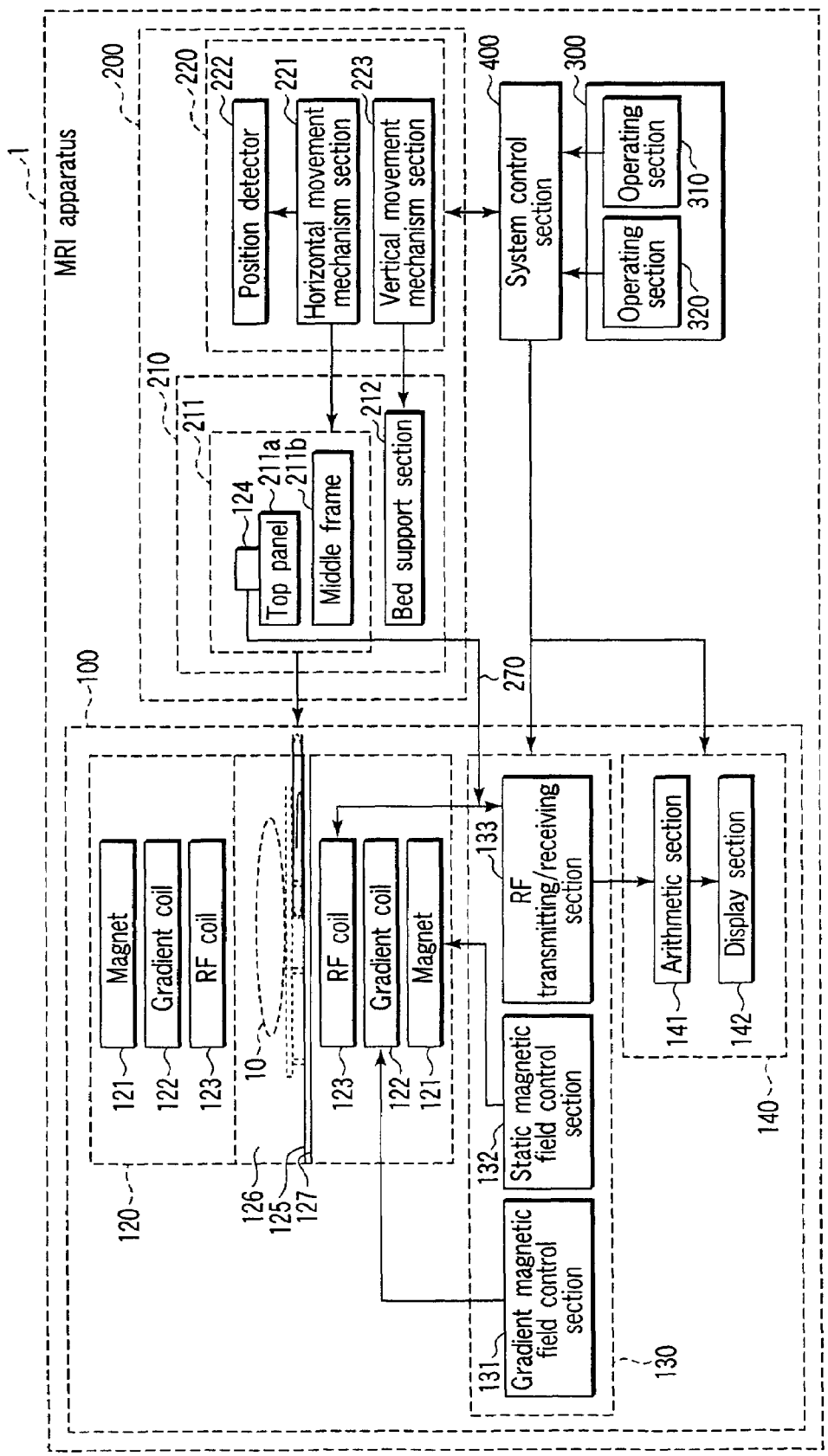
FIG. 1 is a block diagram showing a structure of an MRI apparatus according to an embodiment.

A magnetic resonance imaging apparatus (an MRI apparatus) according to an embodiment will now be explained in detail hereinafter with reference to FIG. 1 to FIGS. 19A, 19B, and 19C. It is to be noted that like reference numerals denote like members in these drawings.

FIG. 1 is a block diagram showing a structure of an MIR apparatus 1 according to this embodiment. The MRI apparatus 1 includes an imaging section 100, a bed device 200, an operating section 300, and a system control section 400. The imaging section 100 collects a magnetic resonance signal (an MR signal) from a subject 10, and performs an arithmetic operation based on the collected MR signal. The bed device 200 sets the subject 10 at an imaging position of the imaging section 100. The operating section 300 accepts an operation by an operator to control the imaging section 100 and the bed device 200. The system control section 400 controls the imaging section 100 and the bed device 200 based on a signal from the operating section 300.

The imaging section 100 includes a gantry 120, a gantry control section 130, and a signal processing section 140.

The gantry 120 includes a magnet 121, a gradient coil 122, an RF coil 123, a receiving coil 124, and a rail 125. A cylindrical imaging space 126 where the subject 10 is imaged is formed in the gantry 120. The magnet 121, the gradient coil 122, and the RF coil 123 are arranged with this imaging space 126 serving as an axis. The rail 125 is provided on a bottom surface 127 of the imaging space 126.

The magnet 121 generates a static magnetic field in the imaging space 126. As this magnet 121, a superconducting magnet can be utilized, for example. When using the superconducting magnet as the magnet 121, a non-illustrated static power supply is provided. The gradient coil 122 is arranged on an inner circumference of the magnet 121. The gradient coil 122 generates a gradient magnetic field in the imaging space 126 when a power is supplied from a non-illustrated gradient power supply. The RF coil 123 is arranged on an inner circumference of the gradient coil 122. When an RF signal is supplied from the gantry control section 130, the imaging space 124 is irradiated with a high-frequency magnetic field to excite a hydrogen atomic nucleus in the subject 10. The RF coil 123 converts the MR signal emitted as an electromagnetic wave into an electric signal state, and outputs the converted MR signal to the gantry control section 130. The receiving coil 124 is arranged in the bed device 200, and fed into the imaging space 126 by the bed device 200 at the time of imaging. The receiving coil 124 converts the MR signal emitted as an electromagnetic wave from the subject 10 into an electric signal state, and outputs the converted MR signal to the gantry control section 130.

The gantry control section 130 includes a gradient magnetic field control section 131, a static magnetic field control section 132, and an RF transmitting/receiving section 133.

The gradient magnetic field control section 131 controls the gradient power supply. The static magnetic field control section 132 controls the static power supply. The RF transmitting/receiving section 133 supplies an RF signal to the RF coil 123. The RF transmitting/receiving section 133 performs reception processing with respect to the MR signals output from the RF coil 123 and the receiving coil 124, and then outputs the processed signals to the signal processing section 140. Further, the RF transmitting/receiving section 133 performs sequence control to carry out generation of a gradient magnetic field, transmission of the RF signal, and reception of the MR signal in accordance with predetermined sequences.

The signal processing section 140 includes an arithmetic section 141 and a display section 142. The arithmetic section 141 reconstructs an image from the MR signal supplied from the RF transmitting/receiving section 133. The display section 142 displays the image reconstructed by the arithmetic section 141. As the display section 142, a CRT (a cathode-ray tube) can be utilized, for example.

The bed device 200 includes a bed movement section 210 and a mechanism section 220. The bed movement section 210 includes a horizontal movement section 211 and a bed support section 212. The horizontal movement section 211 includes a top panel 211 and a middle frame 211b. The subject 10 is mounted on a top surface of the top panel 211a. Furthermore, the receiving coil 124 is arranged on the top panel 211a. The middle frame 211b supports the top panel 211a to be movable in a horizontal direction. The bed support section 212 supports the horizontal movement section 211 to be movable in a vertical direction.

The mechanism section 220 includes a horizontal movement mechanism section 221, a position detector 222, and a vertical movement mechanism section 223. The horizontal movement mechanism section 221 horizontally moves the top panel 211a. The position detector 222 detects a position of the top panel 211a. The vertical movement mechanism section 223 vertically moves the bed support section 212.

The operating section 300 includes an operating section 310 and an operating section 320. The operating section 310 includes an input device, such as a keyboard, a display device, and others. The operating section 310 is used by an operator for an operation of the bed device 200, e.g., an input for setting the subject 10 mounted on the top panel 211a to an appropriate position in the imaging space 126. The operating section 320 is used by the operator to perform an operation of the bed device 200 alone. Moreover, the operating section 320 is arranged on the gantry 120 to enable an operation near the subject 10 when moving the subject 10. Each of the operating section 310 and the operating section 320 supplies a signal indicative of contents of an operation by the operator to the system control section 400.

The system control section 400 has a CPU, a storage circuit, and others. The system control section 400 performs overall control with respect to each section in the MRI apparatus 1 based on an input signal from the operating section 300.

The bed device 200 will now be explained.

Figure 2:
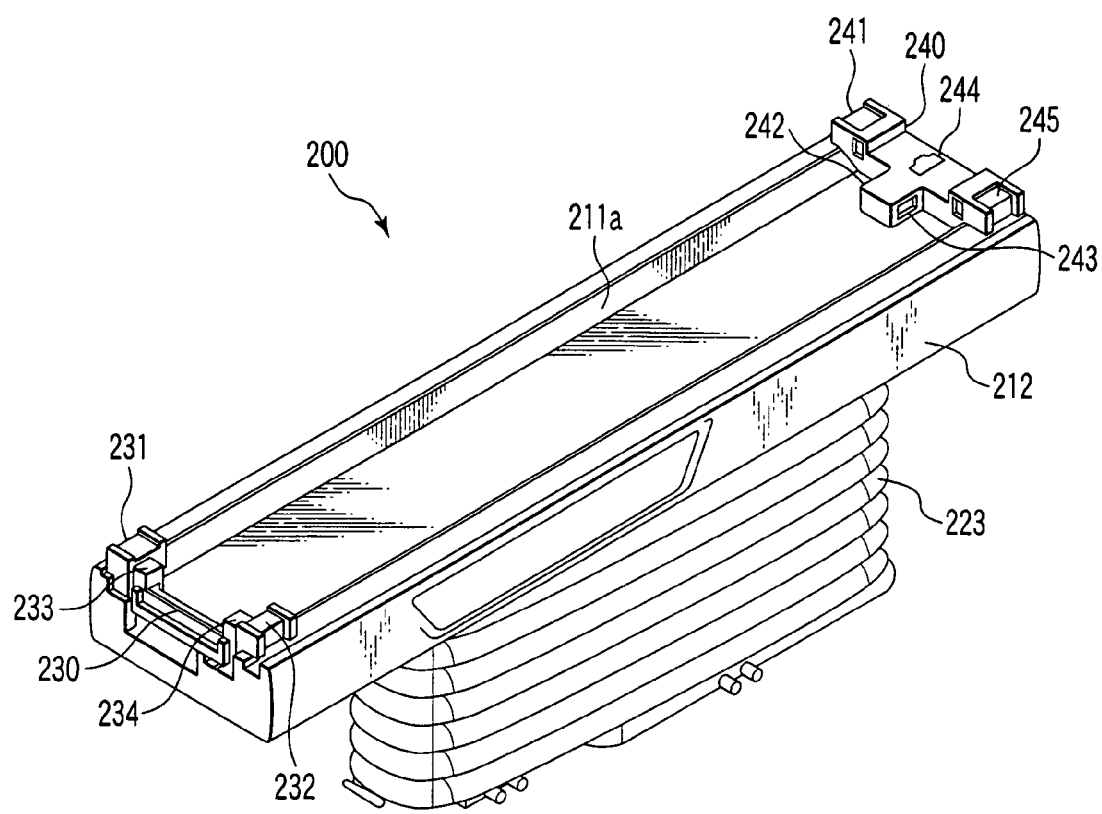
FIG. 2 is a perspective view showing an appearance of a bed device.

FIG. 2 is a perspective view showing an appearance of the bed device 200.

The vertical movement mechanism section 223 is placed on a floor, and covered with an accordion-like cover member. The bed support section 212 is disposed above the vertical movement mechanism section 223. The horizontal movement mechanism section 221 and the position detector 222 are accommodated in the bed support section 212. The top panel 211a is mounted on a top surface of the bed support section 212.

The bed device 200 can move the top panel 211a in the vertical direction when the vertical movement mechanism section 223 moves the bed support section 212 in the vertical direction. Additionally, the horizontal movement mechanism 221 can move the top panel 211a in the horizontal direction to feed the top panel 211a into the imaging space 126. Although structures and operations of the horizontal movement mechanism section 221 and the vertical movement mechanism section 223 are well known, their particulars will be explained later with reference to FIGS. 8A and 8B to FIG. 15.

It is to be noted that the bed device 200 is installed in such a manner that its left side in FIG. 2 faces the imaging space 126 side. Thus, the left side in FIG. 2 will be referred to as a front side and a right side will be referred to as a rear side hereinafter.

The receiving coil 124 is mounted on the top panel 211a at the time of imaging. As the receiving coil 124, various types, e.g., coils for a head region, a head and neck region, a chest region, an abdominal region, a vertebral region, a shoulder region, a heart region, and others are appropriately used. The plurality of receiving coils 124 may be simultaneously mounted on the top panel 211a in some cases. It is to be noted that the single receiving coil 124 may include a plurality of elements therein in some cases.

FIG. 3 is a view showing an example of a use state of the receiving coil 124.

FIG. 3 shows a state where the four receiving coils 124 are used. It is to be noted that reference characters 124a, 124b, 124c, and 124d denote these four receiving coils to discriminate the four receiving coils 124 from each other in FIG. 3. The receiving coils 124a, 124b, 124c, and 124d are respectively used for a chest region, an abdominal region, a vertebral region, and a head and neck region. In the following explanation, they are respectively referred to as the chest region receiving coil 124a, the abdominal region receiving coil 124b, the vertebral region receiving coil 124c, and the head and neck region receiving coil 124d.

The chest region receiving coil 124a is arranged on an abdominal side of the subject 10. The abdominal region receiving coil 124b is arranged on the abdominal side of the subject 10. Each of the chest region receiving coil 124a and the abdominal region receiving coil 124b includes eight coil elements arranged in a matrix shape including four columns and four rows. The vertebral region receiving coil 124c is arranged between the top panel 211a and the back of the subject 10. The vertebral region receiving coil 124c includes 32 coil elements arranged in a matrix shape including four columns and eight rows. In regard to the coil elements included in the vertebral region receiving coil 124c, the coil elements placed in central rows sandwiched between the coil elements placed at both ends in a body width direction are smaller than the coils elements placed at both ends. The head and neck region receiving coil 124d is used in combination with a head rest (not shown) on the top panel 211a.

The receiving coils 124a to 124c depicted in FIG. 3 include a total of 64 (=16+16+32) coil elements. These coil elements can be selectively used as required. That is, when imaging a lumbar region of the subject 10, enabling the coil elements surrounded by a thick line FR1 and a thick line FR4 alone in FIG. 3 can suffice. Further, when imaging a knee region of the subject 10, enabling the coil elements surrounded by a thick line FR2 and a thick line FR5 alone or the coil elements surrounded by a thick line FR3 and a thick line FR6 alone can suffice.

Meanwhile, connection port attachment portions 230 and 240 are respectively provided at a front end and a rear end of the top panel 211a as shown in FIG. 2. Each of the connection port attachment portions 230 and 240 is formed to have the same width as that of the top panel 211a. The connection port attachment portion 230 includes connection ports 231 to 234. The connection port attachment portion 240 includes connection ports 241 to 245. That is, a total of nine connection ports are disposed to the top panel 211a, but the four front connection ports 231 to 234a and the five rear connection ports 241 to 245 are dispersedly arranged.

Cables of the receiving coils 124 are connected with the connection ports 231 to 234 and 241 to 245. The connection port 231 is connected with, e.g., a cable of the head and neck region receiving coil 124d. The connection port 232 is connected with, e.g., a cable of the chest region receiving coil 124a. The connection ports 233 and 234 are connected with, e.g., cables of local receiving coils 124 which are not shown in FIG. 3. The connection port 241 is connected with, e.g., a cable of the abdominal region receiving coil 124b. The connection ports 242 and 243 are connected with, e.g., cables of the vertebral region receiving coil 124c. The vertebral region receiving coil 124c includes two cables since it has many coil elements, and these two cables are respectively connected with the connection ports 242 and 243. The connection ports 244 and 245 are connected with receiving coils 124 that are not depicted in FIG. 3.

It is to be noted that all or some of the connection ports 231 to 234 and 241 to 245 include openable/closable protection lids, respectively. This lid is closed when the corresponding connection port is not used.

Each of the chest region receiving coil 124a, the abdominal region receiving coil 124b, the vertebral region receiving coil 124c, the head and neck region receiving coil 124d, and others often includes an amplifier that amplifies an MR signal in order to assuredly transmit the weak MR signal to the signal processing section 140. However, it is difficult to incorporate the amplifier into the local receiving coil connected with, e.g., the connection port 233 or 234 since this coil itself is small. Therefore, the amplifier may be installed near the connection port 233 or 234 in advance, then the amplifier amplifies the MR signal output from the receiving coil 124, and the amplified signal is transmitted to the signal processing section 140 in some cases.

Figure 4:
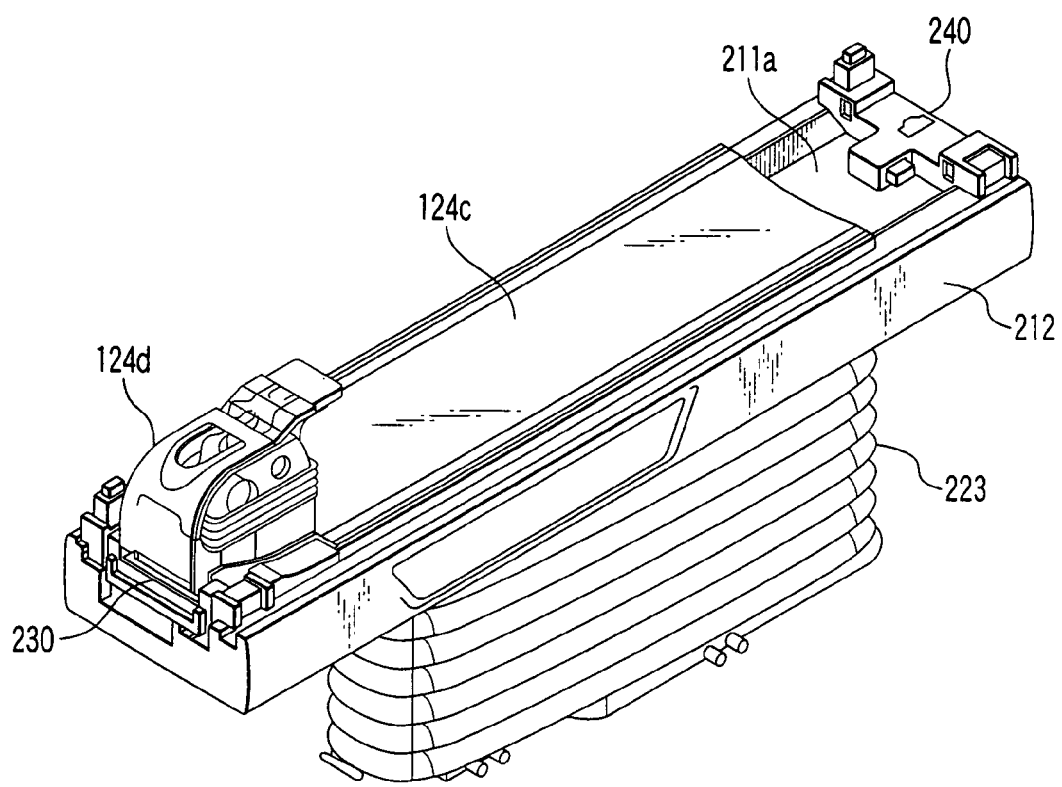
FIG. 4 is a perspective view showing the bed device in a state where a vertebral region receiving coil and a head and neck region receiving coil are mounted on a top panel.

FIG. 4 is a perspective view showing the bed device 200 in a state where the vertebral region receiving coil 124c and the head and neck region receiving coil 124d are mounted on the top panel 211a.

The head and neck region receiving coil 124d is installed at a front end of the top panel 211a. Furthermore, the vertebral region receiving coil 124c is mounted on the top panel 211a from a rear end of the head and neck region receiving coil 124d to a position near a rear end of the top panel 211a. However, the vertebral region receiving coil 124c is formed to have a length that does not allow contact with the connection port attachment portion 240. Although not shown in FIG. 4, the subject 10 lies down on the vertebral region receiving coil 124c, and his/her head is covered with the head and neck region receiving coil 124d. It is to be noted that the cables that connect the vertebral region receiving coil 124c and the head and neck region receiving coil 124d to desired connection ports are not depicted in FIG. 4.

Signal transmission paths that allow the connection ports 231 to 234 and 241 to 245 to be electrically connected with the RF transmitting/receiving section 133 will now be explained.

Although each receiving coil 124 is usually utilized to receive an MR signal emitted from the subject 10, it may be used to transmit an RF signal. Therefore, the connection ports 231 to 234 and 241 to 245 are electrically connected with the RF transmitting/receiving section 133 through cables. Each of these cables is dragged in accordance with a movement of the top panel 211a, but a loss of a signal to be transmitted must be reduced and torsion or tangle of the cable must be avoided even in such a case.

In this embodiment, the cable of each receiving coil 124 is connected from the top panel 211a to the RF transmitting/receiving section 133 via the bed device 200 without being drawn into the gantry 120. Therefore, a cable guide that can bend in a length direction is arranged in a space formed between the top panel 211a and the bed support section 212, and the wiring cables connected with the connection ports 231 to 234 and 241 to 245 are inserted through the cable guide. It is to be noted that the cable guide will be explained later with reference to FIGS. 6A and 6B and FIGS. 7A, 7B, and 7C. Prior to the cable guide, how the wiring cables connected with the connection ports 231 to 234 and 241 to 245 are led to the cable guide will be explained with reference to FIG. 5.

FIG. 5 is a plan view schematically showing a rear surface of the top panel 211a.

As shown in FIG. 5, a first cable guide fixing portion 251 is provided near the connection port attachment portion 240 on the rear surface of the top panel 211a toward the bed support section 212 side. One end of a cable guide 260 is disposed to the first cable guide fixing portion 251. Moreover, the wiring cables 270 respectively connected with all the connection ports 231 to 234 and 241 to 245 are collected in the first cable guide fixing portion 251, and all the wiring cables 270 are accommodated in the cable guide 260 through this first cable guide fixing portion 251.

It is to be noted that each wiring cable 270 extending from the connection ports 231 to 234 and 241 to 245 to the first cable guide fixing portion 251 is depicted as one line, but this is simplified to avoid complication of the drawing, and each wiring cable 270 actually includes the necessary number of core wires for, e.g., transmitting/receiving a signal. Additionally, each wiring cable 270 is fixed on the rear surface of the top panel 211a by a method of, e.g., bonding to avoid slack. Therefore, the respective connection ports 231 to 234 and 241 to 245, the first cable guide fixing portion 251, and the wiring cables 270 move together with the top panel 211a, and the state shown in FIG. 5 is constantly maintained.

FIGS. 6A and 6B are views showing an schematically structure of the cable guide 260. FIG. 6A is a plan view, and FIG. 6B is a side view.

The cable guide 260 includes first parts 261 having U-shaped cross sections, tabular second parts 262, coupling shafts 263, and a lid member (not shown). This cable guide 260 is configured by respectively coupling the first parts 261 adjacent to each other by using the second parts 262 in a state where many first parts 261 are aligned in the same direction at fixed intervals. The two second parts 262 are arranged to be appressed against an upper surface and a lower surface of the first part 261. The second part 262 is supported at both ends thereof by the shafts 263 to be rotatable with respect to each different first part 261. Therefore, the cable guide 260 is formed into a strip shape by alternately arranging and coupling many first parts 261 and second parts 262. Additionally, the cable guide 260 can freely bend by each shaft 263 at each of connecting portions of the first parts 261 and the second parts. Incidentally, in the structure achieved by the first parts 261, the second parts 262, and the shafts 263, lateral surfaces on a side where the first parts 261 are open are open along the entire length.

One end 260X of the thus formed cable guide 260 is fixed to the first cable guide fixing portion 251 as shown in FIG. 5. The wiring cables 270 collected in the first cable guide fixing portion 251 are pulled into the cable guide 260 from the lateral surface side where this cable guide 260 is open. Further, when the non-illustrated lid member is fitted on the lateral side where each first part 261 is open, the wiring cable 270 can be suppressed from protruding from the cable guide 260.

FIGS. 7A, 7B, and 7C are perspective views showing an attachment state of the cable guide in the bed device 200 and changes in a state of the cable guide 260 involved by a movement of the top panel 211a.

The other end 260Y of the cable guide 260 is fixed to a second cable guide fixing portion 252. The second cable guide fixing portion 252 is disposed to the bed support section 212 near a middle part of the bed support section 212 in a longitudinal direction. A cable duct 253 is disposed to the second cable guide fixing portion 252. The cable duct 253 extends in the longitudinal direction of the bed support section 212. The cable duct 253 further reaches the RF transmitting/receiving section 133 through the inner side of the accordion-like cover member that covers the vertical movement mechanism section 223.

Meanwhile, the bed support section 212 is moved in the vertical direction by the vertical movement mechanism section 223, but it is not moved in the horizontal direction. Therefore, the bed support section 212 is placed in a still state with respect to the top panel 211a that moves in the horizontal direction. Further, the cable guide 260 couples the first cable guide fixing portion 251 disposed to the movable top panel 211a with the second cable guide fixing portion 252 disposed to the stationary bed support section 212. Therefore, the cable guide 260 has a length that allows the end 260x to move for a maximum movement range of the top panel 211a in the horizontal direction achieved by the horizontal movement mechanism section 221.

Accordingly, when the top panel 211a is placed at a position which is away from the home position by the maximum movement distance, the cable guide 260 substantially linearly couples the first cable guide fixing portion 251 with the second cable guide fixing portion 252. When the top panel 211a is placed at any position other than that explained above, the cable guide 260 couples the first cable guide fixing portion 251 with the second cable guide fixing portion 252 in a state where it is folded back at a middle part while maintaining a predetermined curvature. It is to be noted that reducing lengths of the wiring cables 270 connected with the connection ports 231 to 234 and 241 to 245 as much as possible is preferable to avoid attenuation of an MR signal or decrease an influence of an RF signal. Therefore, reducing a length of the cable guide 260 placed in the bed support section 212 as much as possible is preferable, and hence providing the second cable guide fixing portion 252 near a middle part of the bed support section 212 in the longitudinal direction to enable positional adjustment is good.

A state of the cable guide 260 involved by a movement of the top panel 211a will be further explained with reference to FIGS. 7A, 7B, and 7C.

Here, FIG. 7A shows a state of the cable guide 260 when the top panel 211a is placed at the home position. FIG. 7B shows a state of the cable guide 260 when the top panel 211a has greatly moved from the home position toward the front side. However, FIGS. 7A and 7B show states where the cable guide 260 is pulled out of the bed device 200 to facilitate understanding the state of the cable guide. FIG. 7C shows a state of the cable guide 260 when the top panel 211a has moved nearly to its maximum movement distance from the home position toward the front side. In the state depicted in FIG. 7C, the top panel 211a is placed in the imaging space 126. It is to be noted that FIG. 7C shows a state where the cable guide 260 is accommodated in the bed support section 212.

As explained above, the end 260X of the cable guide 260 is coupled with the first cable guide fixing portion 251 provided on the rear side of the top panel 211a, and the end 260Y of the cable guide 260 is coupled with the second cable guide fixing portion 252 provided near the middle part of the bed support section 212. Thus, as shown in FIG. 7A, in a state where the top panel 211a is placed at the home position, the cable guide 260 linearly extends from the first cable guide fixing portion 251 side, bends on the second cable guide fixing portion 252 side to have a substantially J-like shape, and is dragged inside the bed support section 212. It is to be noted that a thick arrow in FIG. 7A indicates roughly a position at which the ends 260X and 260Y of the cable guide 260 are coupled with each other.

Further, with a forward movement of the top panel 211a, the end 260X of the cable guide 260 also moves toward the front side, but the end 260Y stays at the same position. When the top panel 211a is moved to some extent, the ends 260X and 260Y move closer to each other, and the cable guide 260 has a substantially U-like shape.

Thereafter, in a state where the top panel 211a further moves to the front side, as shown in FIG. 7B, the cable guide 260 bends to have an inverted-J-like shape. It is to be noted that a thick arrow in FIG. 7B also indicates an roughly position at which ends 260X and 260Y of the cable guide are coupled with each other. Furthermore, in a state where the top panel 211a moves the maximum movement distance from the home position toward the front side, as shown in FIG. 7C, the cable guide 260 has a substantially linear shape.

It is to be noted that, as will be explained later with reference to FIGS. 8A and 8B to FIG. 15, the top panel 211a can protrude toward the front side beyond the bed support section 212 and can be supported. This is realized by providing the middle frame 211b in the horizontal movement section 211 and supporting the top panel 211a in the middle frame 211b. When such a middle frame 211b is included, the wiring cables 270 can be constantly maintained in adequate postures by the cable guide 260 according to this embodiment even though the maximum movement distance of the top panel 211a is increased.

A further detailed structure of the bed device 200 will now be explained with reference to FIGS. 8A and 8B to FIG. 15.

Figure 8A:
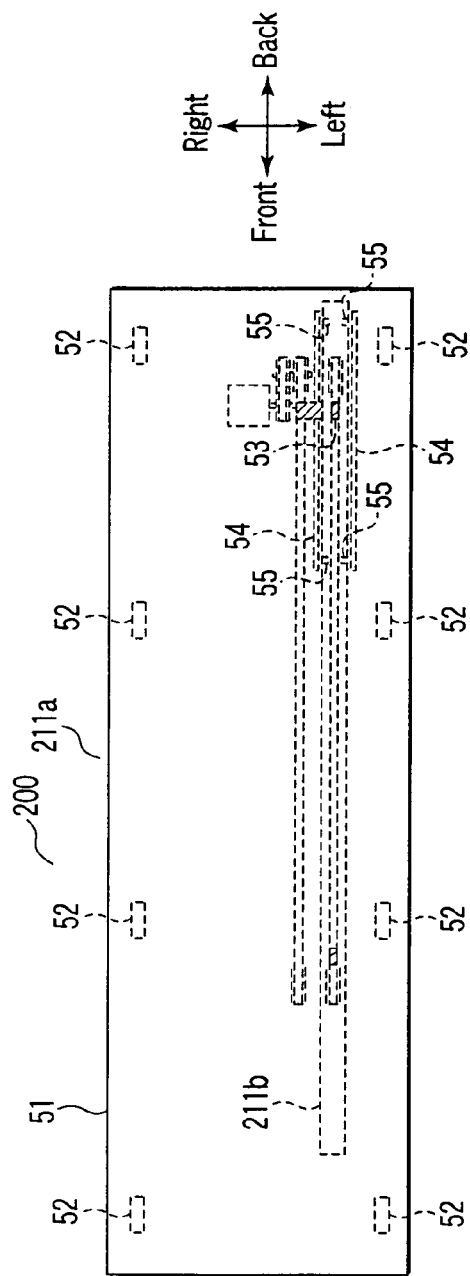
FIGS. 8A and 8B are views showing a detail of a structure of the top panel.
Figure 8B:
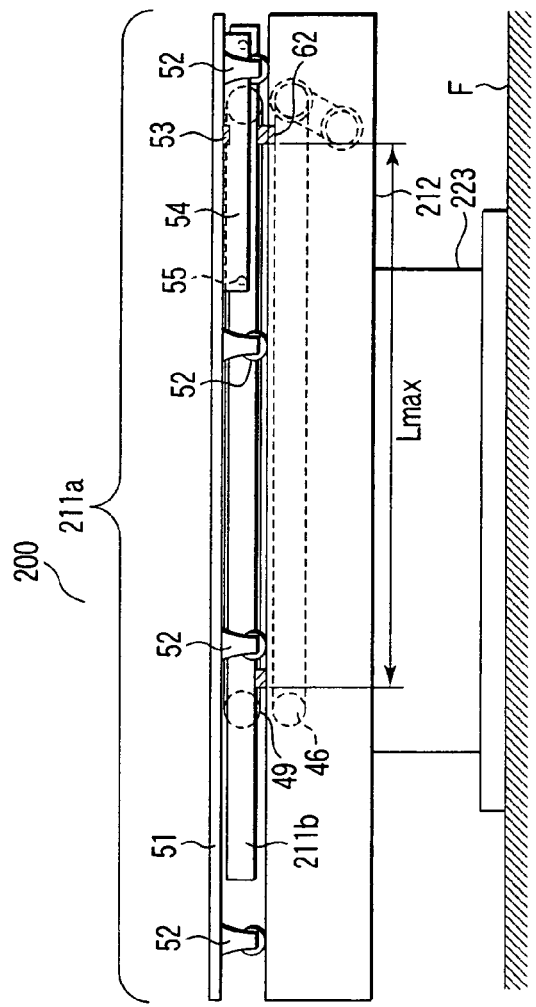

FIGS. 8A and 8B are views showing particulars of the structure of the top panel 211a. FIG. 8A is a plan view showing the bed device 200 from above, and FIG. 8B is a side view of the bed device 200. Moreover, FIGS. 8A and 8B show a state where the top panel 211a is placed at the home position. In the following explanation, a left side in FIG. 8A will be referred to as a front side; a right side, a rear side; an upper side, a right side; and a lower side, a left side. It is to be noted that the connection port attachment portions 230 and 240 are not shown.

The top panel 211a is constituted of a top panel main body 51, a plurality of support legs 52 with rollers, a top panel coupling portion 53, and two middle frame holding portions 54. The top panel main body 51 is a rectangular thin plate on which the subject 10 is mounted. Each support leg with a roller 52 enables a smooth movement of the top panel main body 51 along a longitudinal direction on the front side and the rear side, and supports the top panel main body 51 on the bed support section 212. The top panel coupling portion 53 transmits a driving force from the horizontal movement mechanism section 221 to the top panel main body 51. Each middle frame holding portion 54 holds the middle frame 211b.

Each support leg 52 with the roller is disposed on a lower surface of the top panel main body 51 at a position near each of both ends of the top panel main body 51 on a wide side thereof. The support legs 52 with the rollers are arranged at fixed intervals over the entire wide side of the top panel main body 51. The support legs 52 with the rollers enable a smooth movement of the top panel main body 51 on the bed support section 212 along the longitudinal direction of the top panel main body 51. Moreover, the top panel main body 51 can smoothly move on the rail 125 in the imaging space 126 along the longitudinal direction.

The top panel coupling portion 53 is arranged near a rear end of the lower surface of the top panel main body 51, and couples the top panel main body 51 with a part of the horizontal movement mechanism section 221. Additionally, it transmits a driving force from the horizontal movement mechanism section 221 to the top panel main body 51 to move the top panel 211a forwards or backwards.

The two middle frame holding portions 54 are arranged and fixed to be separated from each other in parallel on the right and left sides of the top panel coupling portion 53 on the lower surface of the top panel main body 51 to support a plurality of rollers 55. Further, the plurality of rollers 55 that respectively engage with the middle frame 211b are arranged on a surface opposite to the side where the middle frame holding portions 54 are arranged, thereby holding the middle frame 211b via the rollers 55 to be movable in the longitudinal direction.

When the subject 10 is mounted on the top panel main body 51 and the horizontal movement mechanism section 221 is driven, the top panel main body 51 is driven through the middle frame 211b and the top panel coupling portion 53. As a result, the top panel main body 51 smoothly moves on the bed support section 212 in the longitudinal direction (a front-and-back direction) through rotation of the rollers of the support legs 52 with the rollers.

FIGS. 9A and 9B are views showing particulars of the structure of the middle frame 211b. FIG. 9A is a partially cutaway plan view of the top panel main body 51, and FIG. 9B is a side view of the bed device 200. Furthermore, FIGS. 9A and 9B show a state where the top panel 211a is placed at the home position.

The middle frame 211b is constituted of a middle frame main body 61 and a middle frame coupling portion 62. The middle frame main body 61 is arranged on a lower side of the top panel 211a. The middle frame coupling portion 62 transmits a driving force from the horizontal movement mechanism portion 221 to the middle frame main body 61. The middle frame main body 61 is arranged on the lower surface of the top panel 211a along the longitudinal direction of the top panel 211a. The middle frame main body 61 has a front end that is placed on a rear side apart from the front end of the top panel 211a, and also has a rear end that is placed near the front end of the top panel 211a apart from the rear end of the same.

Figure 10:
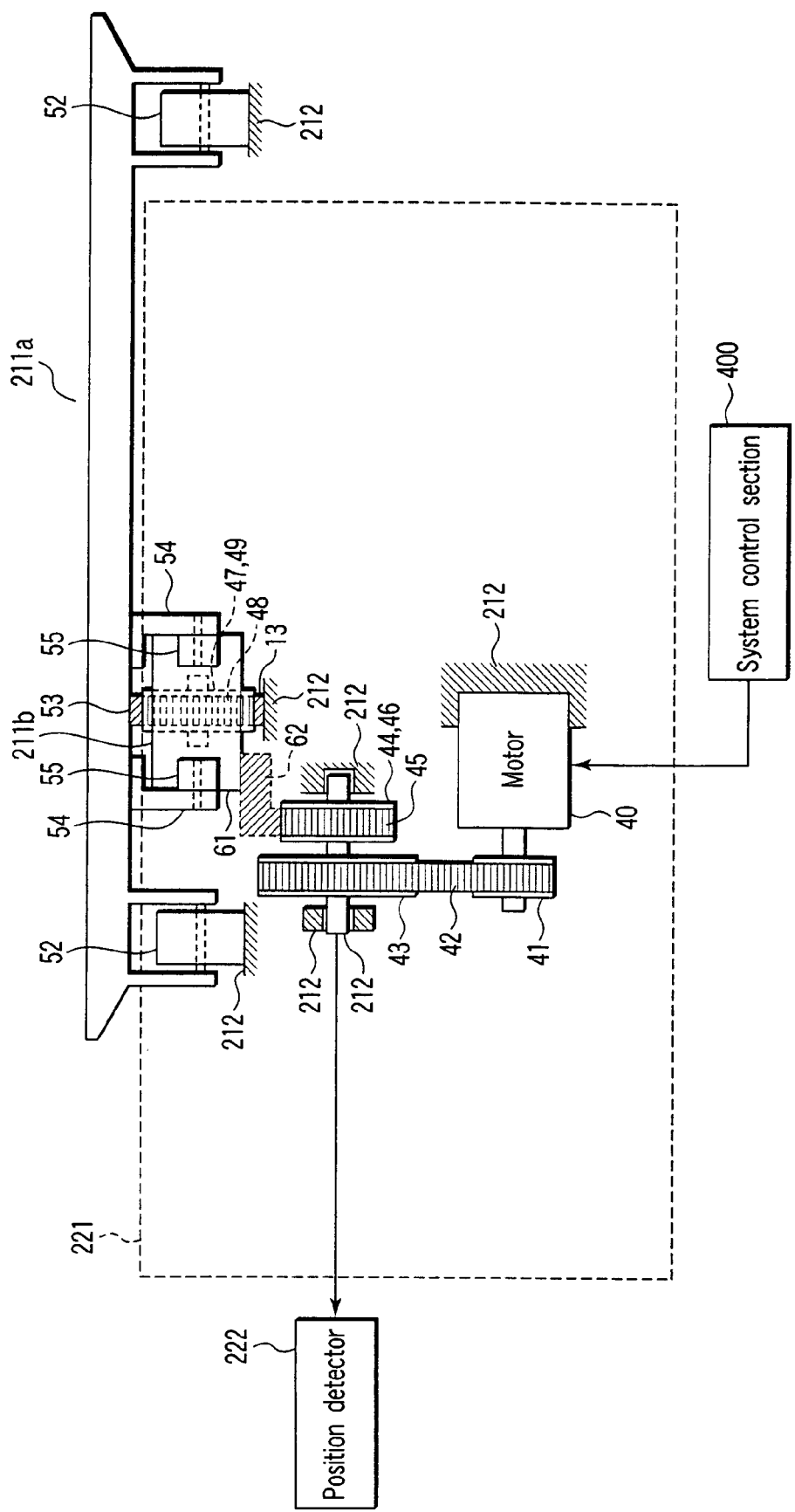
FIG. 10 is a block diagram abstracting and showing a horizontal movement mechanism section when the bed device is seen from a front side.

FIG. 10 is a block diagram abstracting and showing the horizontal movement mechanism section 221 when the bed device 200 is seen from the front side.

As shown in this FIG. 10, in the middle frame main body 10, a shape of its perpendicular cross section parallel to a width direction of the top panel 211a has an I shape, and the rollers 55 engage on both sides of this I shape. As shown in FIG. 10, the middle frame coupling portion 62 is arranged on a front side of the lower surface of the middle frame main body 61 apart from the rear end of the same and on a diagonally downward right side of the top panel coupling portion 53 of the top panel 211a, and couples the middle frame main body 61 with a part of the horizontal movement mechanism section 221. Moreover, it transmits a driving force from the horizontal movement mechanism section 221 to the middle frame main body 61, and thereby moves the middle frame main body 61 forwards from the home position. The bed support section 212 has a top surface having substantially the same rectangular shape as the top panel main body 51, and the support legs 52 with the rollers are mounted on this top surface. Additionally, the bed support section 212 includes a bed support section coupling portion 13 that transmits a driving force from the horizontal movement mechanism section 221 to the middle frame 211b and the top panel 211a, thereby supporting the top panel 211a to be movable in the longitudinal direction.

As shown in FIGS. 9A and 9B, the bed support section coupling portion 13 is arranged on a rear side apart from the front end of the middle frame main body 61, and couples the bed support section 212 with a part of the horizontal movement mechanism section 221. Further, the bed support section coupling portion 13 transmits a driving force from the horizontal movement mechanism section 221 to the middle frame main body 61.

Particulars of the structure of the horizontal movement mechanism section 221 will now be explained with reference to FIGS. 11A and 11B.

Figure 11A:
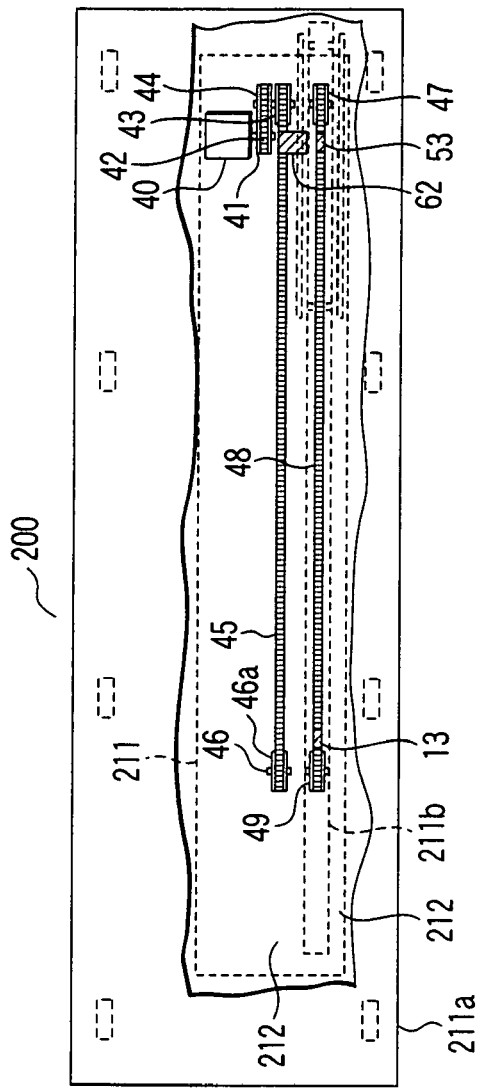
FIGS. 11A and 11B are views showing the horizontal movement mechanism section in a state where the top plate is placed at a home position.
Figure 11B:
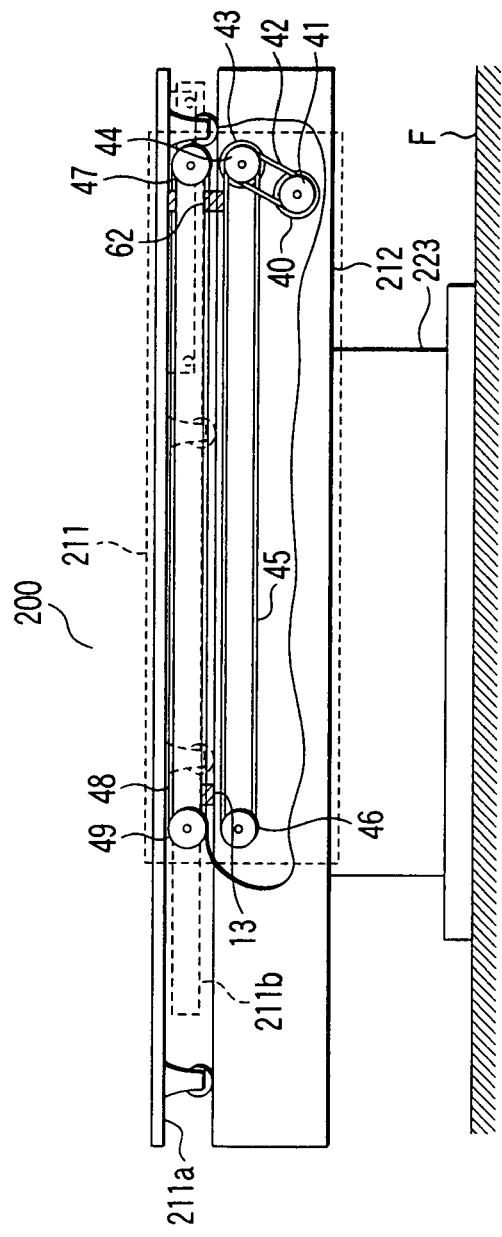

FIGS. 11A and 11B are views showing the horizontal movement mechanism section 221 in a state where the top panel 211a is placed at the home position. FIG. 11A is a block diagram abstracting the horizontal movement mechanism section 221 when an upper part of the bed device 200 is seen from above, and FIG. 11B is a block diagram abstracting the horizontal movement mechanism section 221 when a side part of the bed device 200 is seen from the left side.

The horizontal movement mechanism section 221 is arranged in the bed support section 212 and the middle frame 211b. A mechanism of the horizontal movement mechanism section 221 arranged in the bed support section 212 includes a motor 40, a driving pulley 41, a belt 42, an input pulley 43, a belt 45, and an idle pulley 46. The motor 40 is a power source that drives the horizontal movement section 211 to move the top panel 211a. The driving pulley 41 transmits a driving force of the motor 40 to the belt 42. The input pulley 43 forms a pair with the driving pulley 41, and transmits a driving force from the belt 42 to the output pulley 44. The belt 45 transmits a driving force from the output pulley 44 to the middle frame 211b. The belt 45 is wound around the output pulley 44. The idle pulley 46 forms a pair with the output pulley 44.

Moreover, a mechanism of the horizontal movement mechanism section 221 arranged in the middle frame 211b includes an idle pulley 47, a belt 48, and an idle pulley 49. The belt 48 transmits to the top panel 211a a driving force from the belt 45 that has been transmitted to the middle frame 211b. The idle pulleys 47 and 49 form a pair, and the belt 48 is wound around these pulleys 47 and 48. Additionally, mesh teeth are respectively formed on the driving pulley 41 and the input pulley 43 forming a pair and the belt 42 wound therearound, the output pulley 44 and the idle pulley 46 forming a pair and the belt 45 wound therearound, and the idle pulleys 47 and 49 forming a pair and the belt 48 wound therearound to transmit a driving force. It is to be noted that the idle pulley 46 and the idle pulley 49, or the output pulley 44 and the idle pulley 47 are respectively arranged at the same positions on the home position side. Further the lower belt 45 and the upper belt 48 have the same length.

The motor 40 is fixed to the bed support section 212. Furthermore, the system control section 400 controls the number of revolutions, a rotative direction, a revolving speed, and others of the motor 40. The belt 42 is wound around the driving pulley 41 fixed to a rotary shaft of the motor 40 and the input pulley 43. A driving force of the motor 40 is transmitted to the input pulley 43 via the driving pulley 41 and the belt 42. The number of the teeth on the input pulley 43 is larger than that of the teeth on the driving pulley 41. The input pulley 43 is arranged near the rear side of the middle frame coupling portion 62 of the middle frame 211b, and rotatably supported by the bed support section 212. A rotary shaft of the input pulley 43 is parallel and horizontal to the width direction of the bed support section 212. Moreover, the output pulley 44 has a rotary shaft to be shared with the input pulley 43, and rotates in the same direction with the same number of revolutions as the input pulley 43, thereby transmitting a driving force from the input pulley 43 to the belt 45.

The belt 45 is arranged in parallel with the longitudinal direction of the bed support section 212 in such a manner that upper and lower belt surfaces thereof become parallel, and wound around the output pulley 44 and the idle pulley 46. Additionally, a part of the upper side of the belt 45 near the output pulley 44 and the middle frame main body 61 are coupled with each other through the middle frame coupling portion 62. Further, a driving force from the output pulley 44 is transmitted to the middle frame main body 61 via the middle frame coupling portion 62, thereby horizontally moving the middle frame 211b in the longitudinal direction.

The belt 48 is arranged near the upper surface and the lower surface of the middle frame main body 61 in such a manner that upper and lower belt surfaces thereof become horizontal, and wound around the idle pulleys 47 and 49. The idle pulleys 47 and 49 are rotatably and movably supported by the middle frame 211b. A part of the upper side of the belt 48 near the idle pulley 47 is coupled with the top panel 211a through the top panel coupling portion 53. A part of the lower side of the belt 48 near the idle pulley 49 is coupled with the bed support section 212 through the bed support section coupling portion 13. Furthermore, a driving force transmitted from the belt 45 to the middle frame main body 61 is transmitted to the top panel main body 51 via the bed support section coupling portion 13 and the top panel coupling portion 53, thereby horizontally moving the top panel 211a in the same direction as the middle frame 211b.

The position detector 222 is disposed to the input pulley 43 as shown in FIG. 10, and detects a rotative direction and the number of revolutions of the input pulley 43 by using, e.g., an encoder. The system control section 400 controls the motor 40 based on an output signal from the position detector 222 to set a position of the top panel 211a.

The thus configured horizontal movement mechanism section 221 can horizontally move the middle frame 211b in the longitudinal direction and horizontally move the top panel 211a in the same direction as the middle frame 211b with the single simple structure.

Particulars of the structure of the vertical movement mechanism section 223 will now be explained with reference to FIG. 12.

Figure 12:
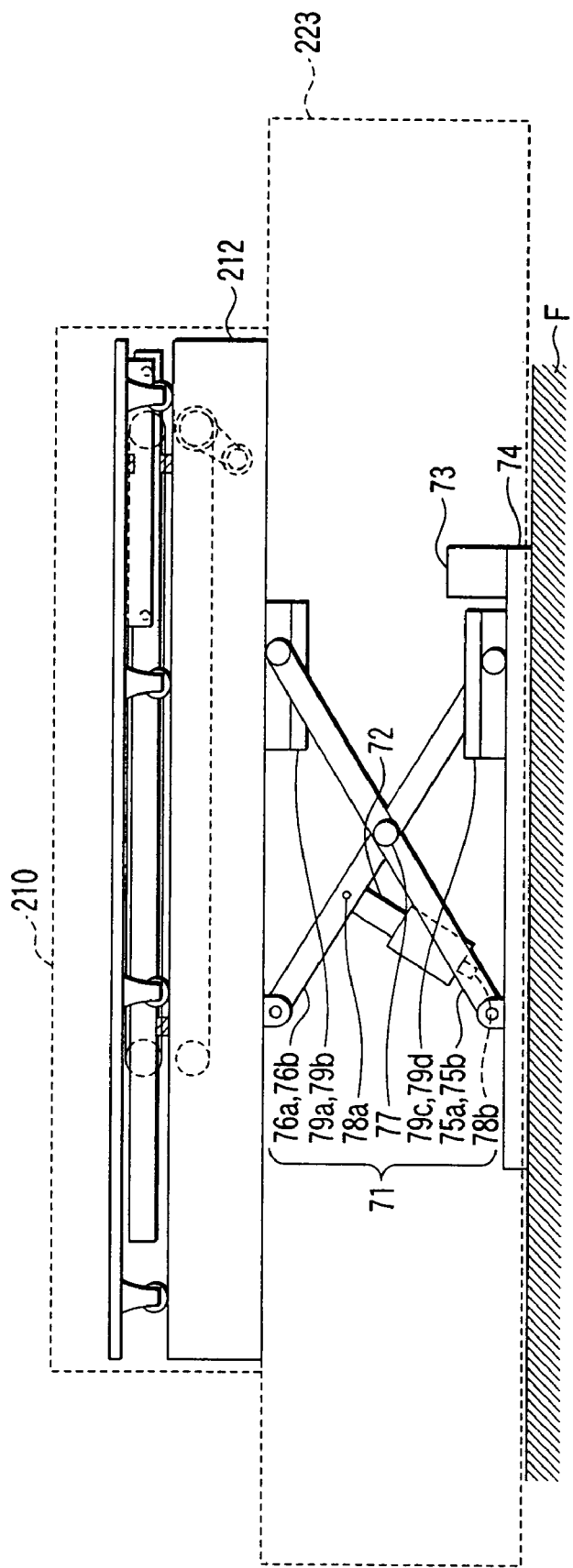
FIG. 12 is a side view showing a structure of a vertical movement mechanism section.

FIG. 12 is a side view showing a structure of the vertical movement mechanism section 223.

The vertical movement mechanism section 223 includes a link mechanism 71, a hydraulic cylinder 72, a hydraulic unit 73, and a link base 74. The link mechanism 71 further includes arms 75a, 75b, 76a, and 76b, a swiveling shaft 77, a support shaft 78a and 78b, and guides 79a to 79d.

The arms 75a and 75b have the same length, and are arranged in parallel with each other in such a manner that they are separated from each other along a width direction (a depth direction in FIG. 12) of the bed support section 212. Therefore, FIG. 12 shows the arm 75a alone which is placed on an operator's hand side, and the arm 75b is hidden behind a rear surface of the arm 75a. One end of each of the arms 75a and 75b is supported at each of both ends of the link base 74 in the width direction to allow a swiveling movement. Further, the other end of each of the arms 75a and 75b is supported by each of the guides 79a and 79b to be slidable in the horizontal direction. The guides 79a and 79b are provided at both ends of the lower surface of the bed support section 212 in the width direction. Therefore, FIG. 12 shows the guide 79a alone which is placed on the operator's hand side, and the guide 79b is hidden behind a rear surface of the guide 79a. The arms 76a and 76b have the same length as the arms 75a and 75b, and are arranged in parallel with each other in such a manner that they are separated from each other in the width direction of the bed support section 212. Therefore, FIG. 12 shows the arm 76a alone which is placed on the operator's hand side, and the arm 76b is hidden behind a rear surface of the arm 76a. The arms 76a and 76b respectively cross the arms 76a and 76b at their central parts. Further, one end of each of the arms 76a and 76b is placed above one end of each of the arms 75a and 75b, and the arms 76a and 76b are supported on the lower surface of the bed support section 212 to allow a swiveling movement. Furthermore, the other end of each of the arms 76a and 76b is placed below the other end of each of the arms 75a and 75b, and the arms 76a and 76b are held by the guides 79c and 79d to be slidable in the horizontal direction. The guides 79c and 79d are provided at both ends of the link base 74 in the width direction. Therefore, FIG. 12 shows the guide 79c alone which is placed on the operator's hand side, and the guide 79d is hidden behind a rear surface of the guide 79c.

One end of the swiveling shaft 77 is inserted into holes formed in the arms 75a and 76a at intersections with respect to the arms 75a and 76a, and the other end of the same is inserted into holes formed in the arms 75b and 76b at intersections with respect to the arms 75b and 76b. The support shafts 78a and 78b are arranged to be horizontal and parallel to each other. One end of the support shaft 78a is fixed above the intersection of the arm 76a with respect to the arm 75a, and the other end of the same is fixed above the intersection of the arm 76b with respect to the arm 75b. Moreover, one end of the support shaft 78b is fixed below the intersection of the arm 75a with respect to the arm 76a, and the other end of the same is fixed below the intersection of the arm 75b with respect to the arm 76b.

One and the other ends of the hydraulic cylinder 72 are supported at central parts of the support shafts 78a and 78b, respectively. The hydraulic unit 73 contains a hydraulic pump that supplies a pressurized oil to the hydraulic cylinder 72, a change valve, and others, and adjusts a length of the hydraulic cylinder 72.

The thus configured vertical movement mechanism section 223 uses the hydraulic unit 73 to expand/contract the hydraulic cylinder 72 under control of the system control section 400, thereby driving the support shafts 78a and 78b. Then, driving forces from the support shafts 78a and 78b allow each of the arms 75a, 75b, 76a, and 76b to swivel with one end thereof and the swiveling shaft 77 being used as a shaft, and allow the other end of each of these arms to slide on each of the guides 79a, 79b, 79c, and 79d, thereby moving the bed movement section 210 in the vertical direction.

An operation of the bed device 200 will now be explained.

After the subject 10 is mounted on the top panel 211a, when an operator uses the operating section 300 to perform a vertical position setting operation with respect to the bed movement section 210, the system control section 400 controls the vertical movement mechanism section 223 to set the bed movement section 210 to a position at which the top surface of the bed support section 212 matches with a height of the rail 125 provided in the imaging space 126. Moreover, when the operator uses the operating section 300 to perform a top panel position setting operation in order to move the subject 10 to an imaging position in the imaging space 126, the system control section 400 controls the horizontal movement mechanism section 221 to move the horizontal movement section 211, thereby setting the top panel 211a to the imaging position in the imaging space 126. Additionally, when the operator uses the operating section 300 to perform a return operation for the home position after imaging is finished, the system control section 400 controls the horizontal movement mechanism section 221 to move the horizontal movement section 211, thereby horizontally moving the top panel 211a to the home position on the bed support section 212.

FIGS. 13A and 13B are views showing a state where the top panel 211a is moving to the imaging position in the imaging space 126. FIG. 13A is a view showing the upper part of the bed device 200 from above, and FIG. 13B is a view showing a side part of the bed device 200 from the left side.

When the operator uses the operating section 300 to perform an operation of moving the top panel 211a from the home position in, e.g., a direction indicated by an arrow L1 by a distance 2L, the system control section 400 instructs the horizontal movement mechanism section 221 to set a position of the top panel 211a. In response to the instruction from the system control section 400, the motor 40 rotates in a direction indicated by an arrow R1, and the horizontal movement mechanism section 221 thereby horizontally moves from the home position in the direction L1. Further, it sets the middle frame 211b to a position separated from the home position by a distance L, and sets the top panel 211a to a position on the rail 125 and the bed support section 212 in the imaging space 126 separated by the distance 2L. Furthermore, when the operator uses the operating section 300 to perform an operation of returning to the home position, the motor 40 rotates in a direction indicated by an arrow R2 in response to the instruction from the system control section 400. As a result, the horizontal movement section 211 is horizontally moved in a direction L2 to be set to the home position.

Subsequently, an operation of the horizontal movement mechanism section 221 when moving the horizontal movement section 211 in the direction L1 will now be explained with reference to FIGS. 14A and 14B. FIGS. 14A and 14B are views for explaining an operation of the horizontal movement mechanism section 221. It is to be noted that FIG. 14A is a view showing the upper part of the bed device 200 from above and FIG. 14B is a view showing the side part of the bed device 200 from the left side.

In a mechanism in the horizontal movement mechanism section 221 supported by the bed support section 212, when the motor 40 rotates in the direction R1, a driving force that rotates the input pulley 43 and the output pulley 44 in the direction R1 is transmitted through the driving pulley 41 and the belt 42. This driving force for this output pulley 44 is transmitted as a driving force that moves the belt 45 in the direction L1.

In a mechanism in the horizontal movement mechanism section 221 supported by the middle frame 211b, based on the driving force for the belt 45, a driving force that moves the middle frame 211b in the direction L1 is transmitted to the middle frame main body 61 coupled with the belt 45 via the middle frame coupling portion 62. Based on this driving force for the middle frame main body 61, a driving force in the direction L1 is transmitted to the idle pulleys 47 and 49 held by the middle frame main body 61. Based on this driving force for the idle pulleys 47 and 49, a driving force in the direction L1 is transmitted to the belt 48 wound around the idle pulleys 47 and 49. However, since the belt 48 is coupled with the bed support section 212 through the bed support section coupling portion 13, the above-explained driving force is transmitted as a driving force that rotates the idle pulleys 47 and 49 in the direction R1 to move the belt 48 in the direction L1. Further, based on the driving force for the belt 48, a driving force that moves the top panel 211a in the direction L1 is transmitted to the top panel main body 51 coupled with the belt 48 via the top panel coupling portion 53, thereby moving the top panel 211a in the direction L1.

A moving distance of the middle frame 211b and the top panel 211a will now be explained.

When the upper side of the belt 45 travels the distance L1 in the direction L1 based on rotation of the motor 40 in the direction R1 at a predetermined number of revolutions, the middle frame main body 61 coupled with the belt 45 via the middle frame coupling portion 62 also travels the distance L. Furthermore, the upper side of the belt 48 travels the distance L based on the movement of the middle frame 211b, and the top panel 211a coupled with the belt 48 via the top panel coupling portion 53 travels the distance L on the middle frame main body 61 in the direction L1. That is, the top panel 211a travels the distance L on the middle frame main body 61 while the middle frame main body 61 travels the distance L in the direction L1. As a result, the top panel 211a travels the double distance 2L in the same direction as the middle frame main body 61 at double the speed of that of the middle frame main body 61 with respect to the bed support section 212, and is set to a position separated from the bed support section 212 apart from the middle frame main body 61.

Moreover, the middle frame main body 61 can move to a position at which the middle frame coupling portion 62 reaches the vicinity of the idle pulley 46. Additionally, the top panel 211a can move to a position at which the top panel coupling portion 53 reaches the vicinity of the idle pulley 49.

Figure 15:
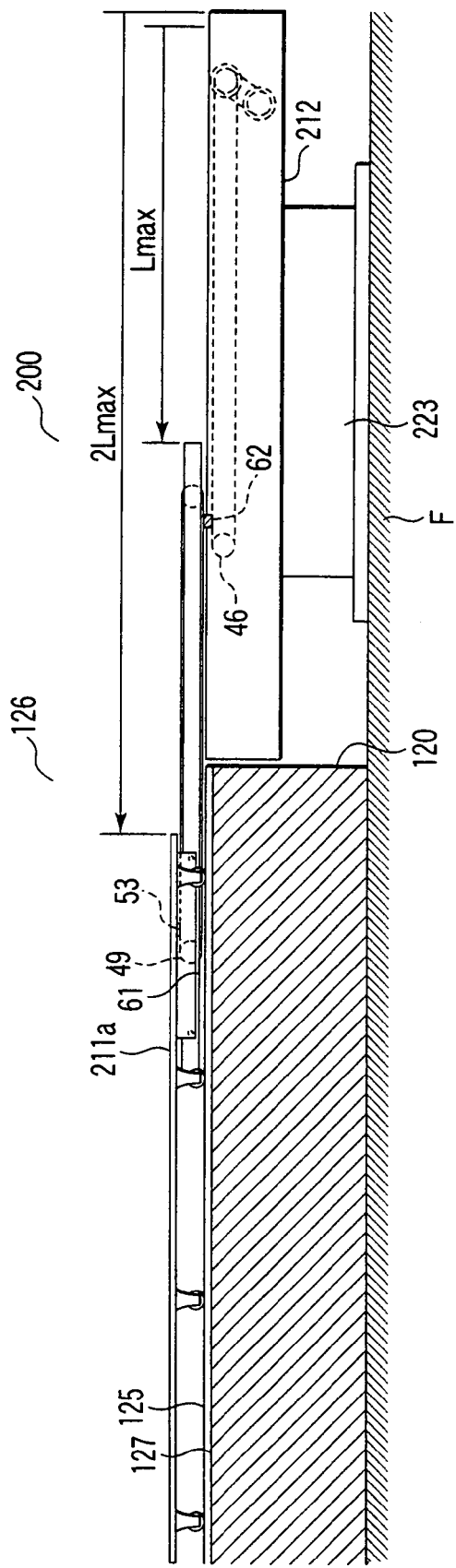
FIG. 15 is a view for explaining a movable distance of the top panel.

Here, each of a gap between the middle frame coupling portion 62 and the vicinity of the idle pulley 46 and a gap between the top panel coupling portion 53 and the vicinity of the pulley 49 at the home position is determined as a distance Lmax (Lmax>L). Then, as shown in FIG. 15, the middle frame main body 61 moves to a position above the bed support section 212 and the bottom surface 127 of the imaging space 126 separated from the home position by the distance Lmax in the direction L1. Further, top panel 211a moves to a position above the rail 125 of the imaging space 126 separated from the home position by a distance 2Lmax that is double the distance Lmax in the direction L1. As explained above, the top panel 211a can be set to the imaging space 126 separated from the bed support section 212 by the distance 2Lmax.

It is to be noted that increasing each of the gap between the middle frame coupling portion 62 and the vicinity of the idle pulley 46 and the gap between the top panel coupling portion 53 and the vicinity of the idle pulley 49 at the home position beyond the distance Lmax enables setting the top panel 211a to a position that is further separated from the home position.

As explained above, when the middle frame 211b and the bed support section 212 are arranged on the lower side of the top panel 211a and the horizontal movement mechanism section 221 having the single simple structure is arranged in the bed support section 212 and the middle frame 211b, the middle frame 211b can be moved in the longitudinal direction together with the top panel 211a, the top panel 211a can be moved in the same direction as the middle frame 211b based on the movement of the middle frame 211b, and the top panel 211a can be set to a position separated from the middle frame 211b. As a result, the top panel 211a can be prevented from being extended in the longitudinal direction, thereby avoiding an increase in size of the bed device 200.

Furthermore, according to the bed device 200, the top panel 211a can be horizontally moved to a position separated from the bed support section 212. That is, the top panel 211a can be horizontally continuously moved into the imaging space 126 over a long distance. Therefore, although a static magnetic field region demonstrating a uniform magnetic field is limited, a demand of imaging an entire body of a subject has been increased in recent years, and an MR image in an extensive range, e.g., a full-length image of the subject 10 can be acquired to meet this demand.

It is to be noted that the top panel 211a having the subject 10 mounted thereon is moved, collateral information, e.g., imaging regions or imaging conditions is added to each of series image data collected in a plurality of imaging regions in a body axis direction of the subject 10. As a result, the series image data of the plurality of imaging regions under desired imaging conditions can be efficiently selected and displayed.

That is, in usual imaging, a plurality of imaging cross sections, e.g., a coronal cross section (a vertical cross section seen from a front side of the subject), a sagittal cross section (a vertical cross section seen from a side surface of the subject), an axial cross section (a lateral cross section vertical to a body axis of the subject), and others are set in a single imaging region. Furthermore, multiple sheets of a plurality of types of image data, e.g., a T1 emphasized image, a T2 emphasized image, an MRA (an MR angio) image, and others are collected at predetermined slice intervals with respect to each of these imaging cross sections. It is to be noted that the imaging cross sections and the image types are all together referred to as imaging conditions, and multiple sheets of image data collected at predetermined slice intervals in time-series under each of the imaging conditions are referred to as series image data.

Moreover, series image data under a plurality of imaging conditions is generated in each of a plurality of imaging regions (a head region, a chest region, an abdominal region, a leg region, and others) that are set by moving the subject 10 mounted on the top panel 211a along its body axis direction at predetermined intervals into the imaging space 126 having a static magnetic field, a gradient magnetic field, and an RF magnetic field formed therein by the magnet 121, the gradient coil 122, and the RF coil 123, information of the above-explained imaging conditions and imaging regions is added to this series image data, and the obtained data is temporarily stored.

Then, series image data having desired imaging conditions added thereto is extracted from the series image data in the plurality of imaging regions having the desired imaging conditions added thereto, and pieces of representative thumbnail data for the extracted series image data in the plurality of imaging regions are generated in accordance with the respective imaging regions. Moreover, the plurality of pieces of obtained representative thumbnail data are displayed in accordance with the imaging regions shown in a human body model of the subject 10, and a list of the series image data corresponding to the representative thumbnail data selected from the plurality of pieces of displayed representative thumbnail data is displayed.

As a result, the series image data in an extensive range can be collected in a plurality of imaging regions in the body axis direction of the subject while moving the top panel 211a having the subject 10 mounted thereon. When continuously displaying the collected series image data in the extensive range, the series image data in the plurality of imaging regions under desired imaging conditions can be efficiently selected and displayed based on information of the imaging regions or the imaging conditions added as collateral information to each piece of the series image data.

Additionally, when selecting series image data in a desired imaging region, selecting the series image data by using representative thumbnail data of the series image data generated in accordance with each imaging region further facilitates the selecting operation. Further, since the representative thumbnail data is displayed in accordance with each imaging region shown in the human body model of the subject 10, the representative thumbnail data corresponding to a desired imaging region can be accurately selected even if determining the imaging region from the representative thumbnail data is difficult.

Meanwhile, the bed device 200 further includes a stretcher top panel that can be shared by itself and a stretcher.

FIG. 16 is a view showing an appearance of a stretcher top panel 250 and an attachment state of this panel with respect to the bed device 200.

The stretcher top panel 250 is mounted on the top panel 211a. When the stretcher top panel 250 is used, the vertebral region receiving coil 124c or the head and neck region receiving coil 124d is mounted on the stretcher top panel 250. The stretcher top panel 250 is previously formed into a shape that does not interfere with the connection port attachment portions 230 and 240 or the connection ports 231 to 234 and 241 to 245, and appressed against the upper side of the top panel 211a.

Figure 17:
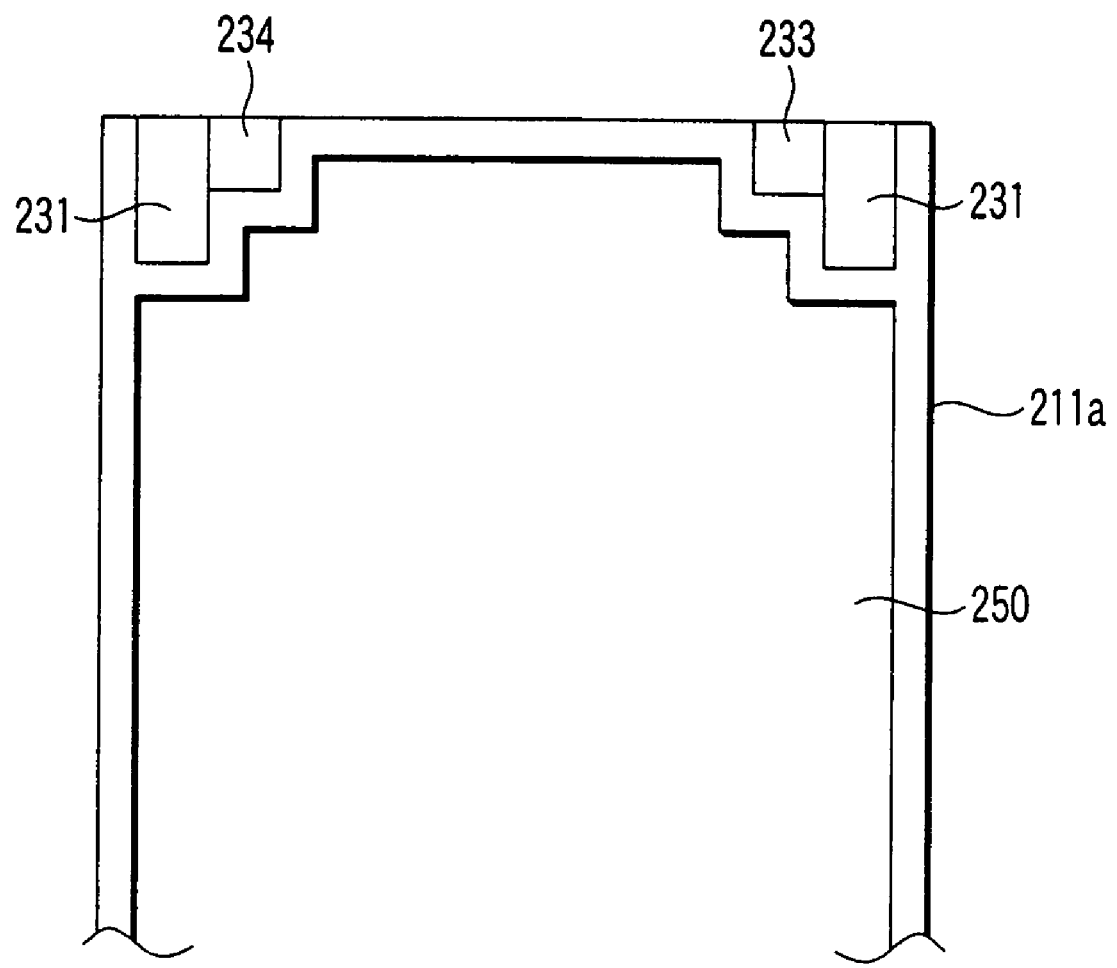
FIG. 17 is a plan view showing a front end of the top panel from above.

FIG. 17 is a plan view showing a front end of the top panel 211a from above.

As shown in FIG. 17, both sides of the front end of the stretcher top panel 250 in the width direction are notched like step shapes to avoid interference with the connection port attachment portion 230. Further, a length of the stretcher top panel 250 is reduced to be shorter than that of the top panel 211a in such a manner that a rear end of the stretcher top panel 250 does not come into contact with the connection port attachment portion 240.

Therefore, in a state where the stretcher top panel 250 is mounted on the top panel 211a, the stretcher top panel 250 is appressed against the top panel 211a while avoiding the connection ports 231 to 234 and 241 to 245. Further, even if the stretcher top panel 250 is mounted, connection between the cables of the receiving coils 124 and the connection ports 231 to 234 and 241 to 245 is not obstructed at all.

Meanwhile, the stretcher top panel 250 can be removed from the upper side of the top panel 221a and mounted on a stretcher. Furthermore, when the subject 10 is carried to the MRI apparatus 1 in a state where the subject 10 lies down on the stretcher top panel 250 mounted on the stretcher, the subject 10 can be mounted on the top panel 221a together with the stretcher top panel 250.

On the other hand, a part of the stretcher is widely opened, and the stretcher can be moved to a position at which the mounted stretcher top panel 250 is placed above the top panel 221a without interfering with the bed device 200. It is to be noted that placing the stretcher in such a manner that the stretcher top panel 250 mounted on the stretcher is positioned above the top panel 221a will be referred to as coupling the bed device 200 with the stretcher hereinafter.

As the stretcher, a first type that couples the stretcher with the bed device 200 from the left side or the right side of the bed device 200 and a second type that couples the stretcher with the bed device 200 from the rear side of the bed device 200 can be considered.

Figure 18:
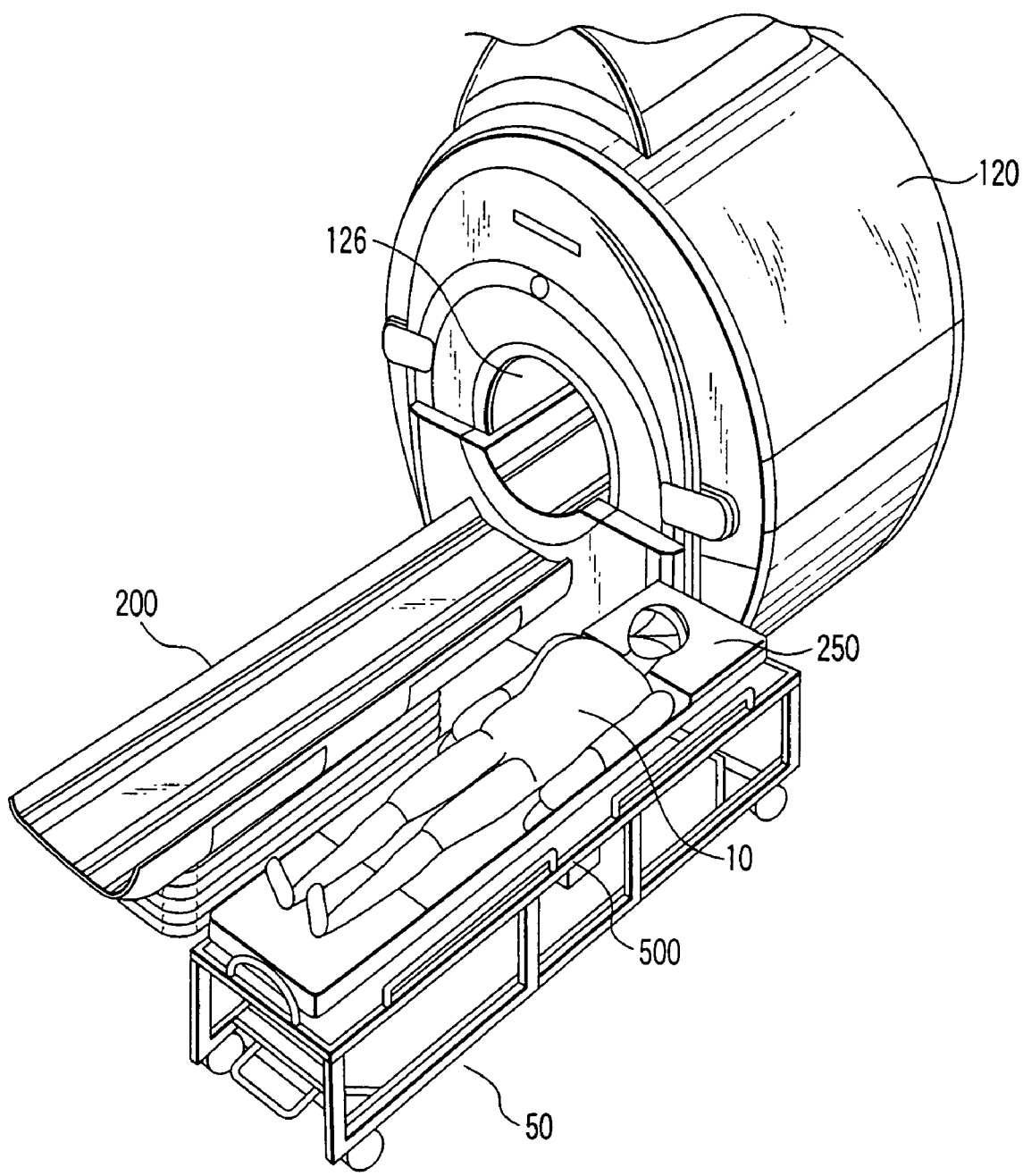
FIG. 18 is a perspective view showing a state before coupling a first type stretcher with the bed device 200.

FIG. 18 is a perspective view showing a state before a first type stretcher 500 is coupled with the bed device 200.

In the state depicted in FIG. 18, the bed device 200 is arranged in a straight direction to face the front of the gantry 120, i.e., a direction along an extension of the imaging space 126. At this time, a height of the bed device 200 is lowered so that the bed device 200 is placed at a low position by the vertical movement mechanism section 223. Further, the stretcher 500 carried with the subject 10 mounted thereon is stopped on the right side of the bed device 200.

A frame 501 in the longitudinal direction is provided on the right side of this stretcher 500 in the state depicted in FIG. 18. However, a frame corresponding to the frame 501 is not present on the left side of the stretcher 500 in the state depicted in FIG. 18, and hence the stretcher 500 can be moved toward and coupled with the bed device 200. That is, the stretcher top panel 250 positioned on the stretcher 500 can be placed immediately above the top panel 211a. It is to be noted that the subject 10 is mounted on the stretcher top panel 250.

In this state, a space having a considerable size is present between the top panel 211a and the stretcher top panel 250. However, when the vertical movement mechanism section 223 is driven to move up the bed support section 212, the surface of the top panel 211a is appressed against the rear surface of the stretcher top panel 250, and the subject 10 can be supplied into the imaging space 126 in this state.

The thus configured MRI apparatus 1 is adapted to be usable with the first type stretcher 500. However, since the frame in the longitudinal direction can be provided on one side alone in the first type stretcher 500, a material with high strength or a special structure must be adopted to assure the necessary strength, thereby becoming disadvantageous in cost.

Contrary, when the stretcher is moved in the longitudinal direction of the bed device 200 from the rear side of the bed device 200 in a state where the longitudinal direction of the second type stretcher matches with the longitudinal direction of the bed device 200, the second type stretcher can be coupled with the bed device 200. Based on this structure, the frame in the longitudinal direction of the stretcher can be provided on both sides, and the strength can be further improved as compared with the first type.

However, the bed device 200 and the stretcher must be linearly aligned in a state where the longitudinal direction of the bed device 200 matches with the longitudinal direction of the stretcher in order to couple the second type stretcher with the bed device 200. Therefore, a sufficient space is required on the rear side of the bed device 200, but assuring this space is often difficult.

Thus, the MRI apparatus 1 has a function of horizontally rotating the bed device 200 as a function of improving convenience in use of the second type stretcher.

Figures 19A, 19B, 19C:
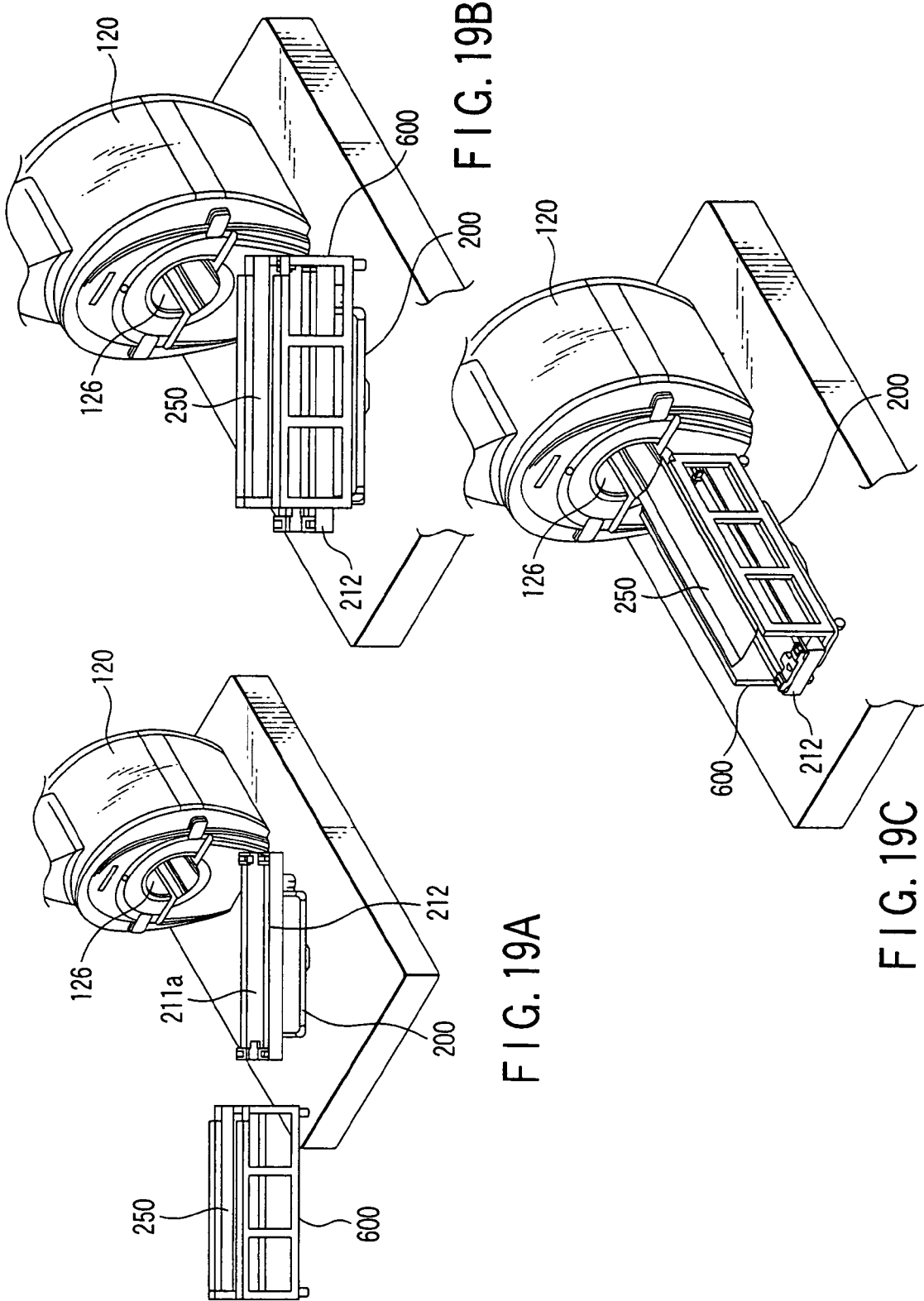
FIGS. 19A, 19B, and 19C are schematic views showing transition when a second type stretcher is coupled with the bed device 200.

FIGS. 19A, 19B, and 19C are schematic views showing transition when a second type stretcher 600 is coupled with the bed device 200. It is to be noted that the subject 10 is omitted in FIGS. 19A, 19B, and 19C.

The bed device 200 is installed to be horizontally rotatable on a floor in such a manner that its direction can be changed within a predetermined angle range with respect to a central axis of the cylindrical imaging space 126. The angle range is 90 degrees at a maximum in a state where the longitudinal direction of the bed device 200 matches with a central axis direction of the imaging space 126 (which will be referred to as a reference state hereinafter). The bed device 200 may be rotatable in one of a clockwise direction and a counterclockwise direction, but it may be of course rotatable in both the directions.

FIG. 19A shows a state where the bed device 200 is rotated approximately 45 degrees in the clockwise direction from the reference state. The stretcher 600 is moved closer to the bed device 200 from the rear side of the bed device 200 which is in this state as shown in FIG. 19A. When the stretcher 600 is moved toward the bed device 200 as it is, the stretcher 600 is coupled with a predetermined position of the bed device 200 as shown in FIG. 19B. Then, when the bed device 200 is rotated in the counterclockwise direction together with the stretcher 600 to be returned to the reference state, the longitudinal directions of the bed device 200 and the stretcher 600 match with the central axis direction of the imaging space 126 as shown in FIG. 19C.

It is to be noted that the angle of the bed device 200 when coupling the stretcher 600 with the bed device 200 is not restricted to 45 degrees, and it is good enough to adopt an arbitrary angle that can assure a sufficient space allowing arrangement of the stretcher 600 on the rear side of the bed device 200.

FIGS. 20A, 20B, and 20C are schematic views showing the transition when the stretcher top panel 250 mounted on the stretcher 600 coupled with the bed device 200 is supplied into the imaging space 126. It is to be noted that the subject 10 is omitted in FIGS. 20A, 20B, and 20C.

FIG. 20A shows a state where the stretcher 600 coupled with the bed device 200 is coupled, and depicts the same state as that in FIG. 19C. In this state, a space of a considerable size is present between the top panel 211a and the stretcher top panel 250. As the next step, the vertical movement mechanism section 223 is driven to move up the bed support section 212. As a result, the surface of the top panel 211a is appressed against the rear surface of the stretcher top panel 250. The bed support section 212 is kept being moved up until the top panel 211a reaches a predetermined height enabling insertion into the imaging space 126. FIG. 20B shows this state.

When the top panel 211a reaches the predetermined height position, driving of the vertical movement mechanism section 223 is stopped, and then the horizontal movement mechanism section 221 is driven to move the horizontal movement section 211 to the imaging space 126. Therefore, the top panel 211a follows the middle frame 211b to be supplied into the imaging space 126, and the stretcher top panel 250 is also supplied into the imaging space 126 based on this movement. FIG. 20C shows a state where the top panel 211a having the stretcher top panel 250 mounted thereon has been supplied into the imaging space 126.

When imaging is finished, the top panel 211a is pulled back to the home position in the horizontal direction. Then, when the bed support section 212 is moved down, the stretcher top panel 250 is supported by the stretcher 600. Further, when the bed support section 212 is moved down, the stretcher top panel 250 and the top panel 211a are separated from each other. As a result, the processing returns to the state depicted in FIG. 20A. Thereafter, when the procedure explained with reference to FIGS. 19A, 19B, and 19C is carried out in the reverse order to separate the stretcher 600 from the bed device 200, the subject 10 can be directly carried into, e.g., a hospital room by using the stretcher 600.

It is to be noted that FIGS. 20A, 20B, and 20C show the example where the stretcher 600 is used, but the operation of supplying the subject 10 into the imaging space 126 is the same when using the stretcher 500.

According to the MRI apparatus 1 explained above in detail, the following effects can be achieved.

(1) The cables or the wiring cables 270 of the receiving coils 124 mounted on the top panel 211a placed at the home position are not exposed in a state where they are pulled into the imaging space 126. Therefore, the cables or the wiring cables 270 of the receiving coils 124 do not obstruct, e.g., an operation of mounting the subject on the top panel, thereby improving the operation efficiency or safety.

(2) The cables or the wiring cables 270 of the receiving coils 124 do not twine around the subject 10 or the top panel 211a with a movement of the top panel 211a, and hence safety is improved and a failure of the apparatus hardly occurs.

(3) Since the connection ports 231 to 234 and 241 to 245 are arranged at both ends of the top panel 211a in the longitudinal direction, the connection ports 231 to 234 and 241 to 245 hardly interfere with the subject 10 mounted on the top panel 211a as compared with an example where the connection ports are arranged near the center of the top panel 211a in the longitudinal direction.

Since no connection port is provided on the sides of the top panel 211a, the subject 10 can get on off the top panel 211a without being obstructed by the connection ports.

Moreover, since the number of the connection ports 231 to 234 provided at the front end of the top panel 211a is smaller than that of the connection ports 241 to 245 arranged at the rear end, the connection ports 231 to 234 and 241 to 245 further hardly interfere with the subject 10 mounted on the top panel 211a. In addition, receiving coils 124a and 124d can be connected to arbitrary ones of connection ports 231-234, receiving coils 124b and 124c can be connected to arbitrary ones of connection ports 241-245, and small-sized local coils can be connected to arbitrary ones of connection ports 231-234. This connection suppresses the interference between the cables of the receiving coils and the subject 10.

(4) Since the end 260X of the cable guide 260 is coupled with the top panel 211a side and the end 260Y of the cable guide 260 is coupled with the vicinity of the middle part of the bed support section 212, the cable length of each wiring cable 270 can be reduced, thereby decreasing transmission losses of a magnetic resonance signal.

(5) Since the stretcher top panel 250 that can be mounted on both the top panel 211a and the stretcher is provided, the subject carried by the stretcher can be readily set to the MRI apparatus 1, and the already imaged subject can be easily carried into, e.g., a hospital room by using the stretcher.

Additionally, since the bed device 200 is configured to be horizontally rotatable, an operation of coupling the bed device 200 with the stretcher while moving the stretcher in the longitudinal direction thereof can be efficiently carried out even in a small examination room.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
   a gantry having an imaging space therein;
   a receiving circuit that receives a magnetic resonance signal emitted from a subject arranged in the imaging space; and
   a bed device on which the subjected is mounted,
   wherein the bed device comprises:
   a top panel on which the subject is mounted;
   a bed support section which supports the top panel to enable moving the top panel in such a manner that the subject mounted on the top panel is positioned in the imaging space;
   connection ports provided on the top panel to connect signal transmission cables of RF coils which convert the magnetic resonance signal into an electric signal; and
   at least one connecting unit which electrically connects signal transmission cables connected to the connection ports with the receiving circuit through a space under the top panel of the bed device.

2. The magnetic resonance imaging apparatus according to claim 1, wherein:
   the plurality of connection ports are provided at a first end of the top panel close to the gantry and a second end of the top panel distant from the gantry, and
   the number of the connection ports provided at the first end is smaller than that of the connection ports provided at the second end.

3. The magnetic resonance imaging apparatus according to claim 1, wherein the connecting unit further comprises:
   wiring cables which electrically connect the connection ports with the receiving circuit; and
   a bendable cable guide member which is arranged in a space portion between a lower surface of the top panel and the bed support section to guide the wiring cables.

4. The magnetic resonance imaging apparatus according to claim 3, wherein one end of the cable guide member is fixed to the top panel and the other end of the cable guide member is fixed to the vicinity of a central part of the bed support section.

5. The magnetic resonance imaging apparatus according to claim 1, wherein the bed device further comprises an amplifier which is arranged near some of the connection ports to amplify signals from the RF coils connected with the connection ports.

6. The magnetic resonance imaging apparatus according to claim 1, further comprising a stretcher top panel which can be mounted on both the top panel and a stretcher and on which the subject is mounted, the stretcher top panel being formed into a shape that does not interfere with the connection ports when mounted on the top panel.

7. The magnetic resonance imaging apparatus according to claim 1, wherein the bed device is rotatable in a horizontal direction to change a direction of the top panel in the horizontal direction.

8. A magnetic resonance imaging apparatus comprising:
   a gantry containing a static magnet and gradient magnetic coils which, in conjunction with at least one RF coil, define an imaging volume therewithin;
   a bed support pedestal disposed outside said magnet and gradient coils;
   a patient support bed movably mounted on top of said support pedestal to transport a patient into said imaging volume by moving said bed into said gantry and away from said pedestal;
   said movable patient support bed carrying RF connection ports for mated RF electrical connection with at least one removable RF coil structure also carried on said movable patient support bed; and
   at least one flexible RF cable connected at one end to said RF connection ports and extending longitudinally in a space located under said movable patient support bed towards a location that is fixed with respect to said pedestal, said flexible RF cable extending along a changing J- or U-shaped configuration as the bed is moved relative to said fixed pedestal.

9. A magnetic resonance imaging apparatus as in claim 8, wherein said fixed pedestal includes an inner space through which extend RF electrical cables coupled to carry RF signals to and/or from said RF connection ports carried by the movable bed.

10. A magnetic resonance imaging apparatus as in claim 8, further comprising:
    at least one flexible cable guide member physically coupled to said at least one flexible RE cable for guiding its movement along said changing J- or U-shaped configuration as the bed is moved relative to said pedestal.

11. A magnetic resonance imaging apparatus as in claim 6, further comprising at least one RE amplifier disposed at said RF connection ports for amplifying a received RF signal from an RE coil before the received RE signal passes to said at least one flexible RF cable.

12. A magnetic resonance imaging apparatus as in claim 8, wherein said patient support bed is rotatable about a vertical axis with respect to said pedestal, said axis being approximately aligned with said fixed location.

13. A magnetic resonance imaging apparatus comprising:
    a gantry having an imaging space therein;
    a receiving circuit that receives a magnetic resonance signal emitted from a subject arranged in the imaging space; and
    a bed device on which the subject is mounted,
    wherein the bed device comprises:
    a top panel on which the subject is mounted;
    a bed support section which supports the top panel to enable moving the top panel in such a manner that the subject mounted on the top panel is positioned in the imaging space; and
    connection ports provided on the top panel to connect signal transmission cables of RF coils which convert the magnetic resonance signal into an electric signal, and
    wherein the plurality of connection ports are provided at a first end of the top panel close to the gantry and a second end of the top panel distant from the gantry, and the number of the connection ports provided at the first end is smaller than that of the connection ports provided at the second end.

14. The magnetic resonance imaging apparatus according to claim 1, further comprising a middle frame that is arranged between the top panel and the bed support section and that moves on the bed support section to move the top panel in its longitudinal direction.

* * * * *